United States Patent
Huang et al.

(10) Patent No.: US 10,536,240 B2
(45) Date of Patent: Jan. 14, 2020

(54) CHANNEL ENCODING METHOD AND APPARATUS IN WIRELESS COMMUNICATIONS

(71) Applicant: HUAWEI TECHNOLOGIES CO., LTD., Shenzhen, Guangdong (CN)

(72) Inventors: Lingchen Huang, Hangzhou (CN); Shengchen Dai, Hangzhou (CN); Chen Xu, Hangzhou (CN); Yunfei Qiao, Hangzhou (CN); Rong Li, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/146,429

(22) Filed: Sep. 28, 2018

(65) Prior Publication Data

US 2019/0044656 A1    Feb. 7, 2019

Related U.S. Application Data

(63) Continuation of application No. PCT/CN2018/086329, filed on May 10, 2018.

(30) Foreign Application Priority Data

Aug. 7, 2017 (CN) .......................... 2017 1 0667569

(51) Int. Cl.
   *H04L 1/00* (2006.01)
(52) U.S. Cl.
   CPC .......... *H04L 1/0058* (2013.01); *H04L 1/0041* (2013.01); *H04L 1/0057* (2013.01); *H04L 1/0061* (2013.01); *H04L 1/0071* (2013.01)
(58) Field of Classification Search
   CPC ..................... H04L 1/0058; H04L 1/0071
   See application file for complete search history.

(56) References Cited

U.S. PATENT DOCUMENTS

| | | | |
|---|---|---|---|
| 2016/0079999 A1* | 3/2016 | Shen | H03M 13/09 714/758 |
| 2016/0218743 A1 | 7/2016 | Li et al. | |
| 2017/0155405 A1 | 6/2017 | Ge et al. | |

FOREIGN PATENT DOCUMENTS

| | | |
|---|---|---|
| CN | 101286745 A | 10/2008 |
| CN | 103825669 A | 5/2014 |

(Continued)

OTHER PUBLICATIONS

R1-1701630 Ericsson,"Design of CRC-assisted Polar Code",3GPP TSG-RAN WG1 #88,Athens, Greece, Feb. 13-17, 2017,total 7 pages.

(Continued)

*Primary Examiner* — Thien Nguyen
(74) *Attorney, Agent, or Firm* — David William Roe

(57) ABSTRACT

This application provides a channel encoding method and apparatus in wireless communications. The method includes: performing CRC encoding on A to-be-encoded information bits, to obtain a first bit sequence, where the first bit sequence includes L CRC bits and A information bits; performing an interleaving operation on the first bit sequence, to obtain a second bit sequence, where a first interleaving sequence used for the interleaving operation is obtained based on a system-supported maximum-length interleaving sequence with the length of $K_{max}+L$, and $K_{max}$ is a maximum information bit quantity corresponding to the maximum-length interleaving sequence and a preset rule, and a length of the first interleaving sequence is equal to A+L. Therefore, during distributed CRC encoding, when an information bit quantity is less than the maximum information bit quantity, an interleaving sequence required for completing an interleaving process is obtained based on the system-supported maximum-length interleaving sequence.

8 Claims, 4 Drawing Sheets

(56) References Cited

FOREIGN PATENT DOCUMENTS

| CN | 104219019 A | 12/2014 |
|---|---|---|
| CN | 108540141 A | 9/2018 |
| WO | 2018202097 A1 | 11/2018 |

OTHER PUBLICATIONS

3GPP TS 38.212 V0.0.0 (May 2017),3rd Generation Partnership Project;Technical Specification Group Radio Access Network;NR;Multiplexing and channel coding(Release 15),total 10 pages.
Nokia et al: "Design details of distributed CRC", 3GPP DRAFT; R1-1708833, vol. RAN WG1, No. Hangzhou; May 14, 2017, XP051274016, 7 pages.
Nokia: "Distributed CRC Polar code construction", 3GPP DRAFT; R1-1711539, vol. RAN WG1, No. Qingdao, P.R. China; Jun. 19, 2017, XP051305707, 6 pages.
Qualcomm Incorporated:"Decoding and Encoding Latency for Polar Codes with PC Frozen Bits or Distributed CRC Bits", 3GPP DRAFT; R1-1711216, vol. RAN WG1, No. Qingdao; Jun. 26, 2017, XP051300415, 4 pages.

\* cited by examiner

CHANNEL ENCODING METHOD AND APPARATUS IN WIRELESS COMMUNICATIONS

CROSS-REFERENCE TO RELATED APPLICATIONS

This application is a continuation of International Application No. PCT/CN2018/086329, filed on May 10, 2018, which claims priority to Chinese Patent Application No. 201710667569.7, filed on Aug. 7, 2017. The disclosures of the aforementioned applications are hereby incorporated by reference in their entireties.

TECHNICAL FIELD

This application relates to the field of communications technologies, and in particular, to an encoding method and apparatus.

BACKGROUND

Channel encoding is usually used in a communications system, to improve data transmission reliability and ensure communication quality. A polar (polar) code is the first channel encoding method that can be strictly proved to "achieve" a channel capacity. The polar code is a type of linear block code, a generator matrix of the polar code is $G_N$, an encoding process of the polar code is $x_1^N = u_1^N G_N$, and $u_1^N = (u_1, u_2, \ldots, u_N)$ is a binary row vector with a length N (namely, a code length). $G_N = B_N F_2^{\otimes (\log_2(N))}$. Herein, $$F_2 = \begin{bmatrix} 1 & 0 \\ 1 & 1 \end{bmatrix},$$

$B_N$ is an N×N transposed matrix, for example, a bit-reversal-order transposed matrix, $F_2^{\otimes (\log_2(N))}$ is defined as a Kronecker (Kronecker) product of $\log_2 N$ matrices $F_2$, $x_1^N$ is encoded bits (also referred to as a code word), and the encoded bits are obtained after $u_1^N$ is multiplied by the generator matrix $G_N$. A multiplication process is the encoding process. In the encoding process of the polar code, some bits in $u_1^N$ are used to carry information and are referred to as information bits, and an index set of the information bits is denoted as A. The other bits in $u_1^N$ are set to fixed values that are agreed on by a transmit end and a receive end in advance, and are referred to as frozen bits, and an index set of the frozen bits is represented by a complementary set $A^c$ of A. The frozen bits are usually set to 0. A sequence of the frozen bits may be set to any values if the transmit end and the receive end reach an agreement in advance. To improve performance of the polar code, an outer code with a check capability may be concatenated with the polar code. CA-polar code is a polar code concatenated with a cyclic redundancy check (CRC) code.

An encoding process of the CA-polar code is as follows: CRC encoding is performed on information bits of to-be-encoded information, to obtain a bit sequence after the CRC encoding, where the bit sequence obtained after the CRC encoding includes information bits and CRC bits; then, polar encoding is performed on the bit sequence obtained after the CRC encoding. A CA-SCL (CRC-Aided Successive Cancellation List) decoding algorithm is used for decoding the CA-polar code. After SCL decoding ends, CRC check is performed on L candidate paths that are output after the SCL decoding, and a candidate path whose CRC check succeeds is used as a decoding output result. If there is no candidate path whose CRC check succeeds, it is determined that the decoding fails. Therefore, for the CA-polar code, CRC check can be performed only after channel decoding ends, and time occupied for a failed decoding process is the same as time occupied for a successful decoding process. In a scenario of downlink blind detection on a control channel in a wireless communications system, dozens of decoding attempts usually need to be made, but a maximum of one decoding attempt can succeed. If a decoding attempt that results in a decoding failure can be stopped in advance (early termination), a decoding delay and average energy consumption of the entire blind detection can be effectively reduced. Distributed CRC encoding is put forward as a CRC encoding manner with an "early termination" capability. During the distributed CRC encoding, an interleaving operation is introduced after conventional CRC encoding ends; to be specific, CRC bits obtained after CRC encoding are distributed among information bits. In an SCL decoding process of a decoder, at a moment before decoding ends, when none of candidate paths can meet check of some CRC bits that have been decoded, the decoding can end in advance.

The interleaving operation is performed by using a pre-stored interleaving sequence. Because a CRC encoding process is related to an information bit quantity, a length of the interleaving sequence is the same as the information bit quantity. If a system needs to support an excessively large quantity of information bits, the system needs to store a large quantity of interleaving sequences. Consequently, system storage overheads are relatively high.

SUMMARY

This application provides an encoding method and apparatus, so that during distributed CRC encoding, when an information bit quantity is less than a maximum information bit quantity, an interleaving sequence required for completing an interleaving process is obtained based on a system-supported maximum-length interleaving sequence.

According to a first aspect, this application provides an encoding method, including: performing cyclic redundancy check (CRC) encoding on A to-be-encoded information bits, to obtain a first bit sequence, where the first bit sequence includes L CRC bits and A information bits, and L and A are positive integers; performing an interleaving operation on the first bit sequence, to obtain a second bit sequence, where a first interleaving sequence used for the interleaving operation is obtained based on a system-supported maximum-length interleaving sequence and a preset rule, and a length of the first interleaving sequence is equal to A+L; or a second interleaving sequence used for the interleaving operation is the maximum-length interleaving sequence, a length of the second interleaving sequence is equal to $K_{max}+L$, and $K_{max}$ is a maximum information bit quantity corresponding to the maximum-length interleaving sequence; and performing polar encoding on the second bit sequence.

According to the encoding method provided in the first aspect, a transmit end performs CRC encoding on the A to-be-encoded information bits, to obtain the first bit sequence, and then performs the interleaving operation on the first bit sequence, to obtain the second bit sequence. The first interleaving sequence used for the interleaving operation is obtained based on the maximum-length interleaving sequence and the preset rule, and the length of the first interleaving sequence corresponds to the quantity of to-be-encoded information bits. Alternatively, the second interleaving sequence used for the interleaving operation is directly the maximum-length interleaving sequence. Finally, the transmit end performs polar encoding on the second bit sequence. Therefore, during distributed CRC encoding, when an information bit quantity is less than the maximum information bit quantity, an interleaving sequence required for completing an interleaving process is obtained based on the system-supported maximum-length interleaving sequence.

In a possible design, the preset rule is: the first interleaving sequence is constituted by sequentially extracting all indexes greater than or equal to $K_{max}-A$ from the maximum-length interleaving sequence and subtracting $K_{max}-A$ from each of all the extracted indexes; and the performing an interleaving operation on the first bit sequence includes: performing the interleaving operation on the first bit sequence by using the first interleaving sequence, to obtain the second bit sequence.

According to the encoding method provided in this implementation, when the interleaving operation is performed by using the first interleaving sequence, parallel processing may be used during an operation of obtaining the first interleaving sequence based on the maximum-length interleaving sequence and the preset rule. After the first interleaving sequence is obtained, the second bit sequence may be directly obtained by performing the interleaving operation on the first interleaving sequence, so that a delay can be reduced, thereby reducing an encoding delay.

In a possible design, the preset rule is: the first interleaving sequence is constituted by sequentially extracting all indexes less than A or greater than or equal to $K_{max}$ from the maximum-length interleaving sequence and subtracting $K_{max}-A$ from indexes greater than or equal to $K_{max}$ in the extracted indexes; and the performing an interleaving operation on the first bit sequence includes: arranging the A information bits in the first bit sequence in descending order of information bit indexes, to obtain a third bit sequence; and performing the interleaving operation on the third bit sequence by using the first interleaving sequence, to obtain the second bit sequence.

According to the encoding method provided in this implementation, when the interleaving operation is performed by using the first interleaving sequence, parallel processing may be used during an operation of obtaining the first interleaving sequence based on the maximum-length interleaving sequence and the preset rule. After the first interleaving sequence is obtained, the second bit sequence may be directly obtained by performing the interleaving operation on the first interleaving sequence, so that a delay can be reduced, thereby reducing an encoding delay.

In a possible design, when the second interleaving sequence used for the interleaving operation is the maximum-length interleaving sequence, the performing an interleaving operation on the first bit sequence includes: extending the first bit sequence to a fourth bit sequence including $K_{max}+L$ bits, where values of first $K_{max}-A$ bits in the fourth bit sequence are set to NULL, and remaining bits sequentially correspond to the bits in the first bit sequence from a $(K_{max}-A+1)^{th}$ bit; performing the interleaving operation on the fourth bit sequence by using the maximum-length interleaving sequence, to obtain a fifth bit sequence; and removing, from the fifth bit sequence, the bits whose values are NULL, to obtain the second bit sequence.

In a possible design, the maximum-length interleaving sequence is any sequence in Table 1 in this specification.

In a possible design, the maximum-length interleaving sequence is any sequence in Table 2 in this specification.

According to a second aspect, this application provides an encoding apparatus, including: a first encoding module, configured to perform cyclic redundancy check (CRC) encoding on A to-be-encoded information bits, to obtain a first bit sequence, where the first bit sequence includes L CRC bits and A information bits, and L and A are positive integers; an interleaving module, configured to perform an interleaving operation on the first bit sequence, to obtain a second bit sequence, where a first interleaving sequence used for the interleaving operation is obtained based on a system-supported maximum-length interleaving sequence and a preset rule, and a length of the first interleaving sequence is equal to A+L; or a second interleaving sequence used for the interleaving operation is the maximum-length interleaving sequence, a length of the second interleaving sequence is equal to $K_{max}+L$, and $K_{max}$ is a maximum information bit quantity corresponding to the maximum-length interleaving sequence; and a second encoding module, configured to perform polar encoding on the second bit sequence.

In a possible design, the preset rule is: the first interleaving sequence is sequentially constituted by extracting all indexes greater than or equal to $K_{max}-A$ from the maximum-length interleaving sequence and subtracting $K_{max}-A$ from each of all the extracted indexes; and the interleaving module is configured to perform the interleaving operation on the first bit sequence by using the first interleaving sequence, to obtain the second bit sequence.

In a possible design, the preset rule is: the first interleaving sequence is constituted by sequentially extracting all indexes less than A or greater than or equal to $K_{max}$ from the maximum-length interleaving sequence and subtracting $K_{max}-A$ from indexes greater than or equal to $K_{max}$ in the extracted indexes; and the interleaving module is configured to: arrange the A information bits in the first bit sequence in descending order of information bit indexes, to obtain a third bit sequence; and perform the interleaving operation on the third bit sequence by using the first interleaving sequence, to obtain the second bit sequence.

In a possible design, when the second interleaving sequence used for the interleaving operation is the maximum-length interleaving sequence, the interleaving module is configured to: extend the first bit sequence to a fourth bit sequence including $K_{max}+L$ bits, where values of first $K_{max}-A$ bits in the fourth bit sequence are set to NULL, and remaining bits sequentially correspond to the bits in the first bit sequence from a $(K_{max}-A+1)^{th}$ bit; perform the interleaving operation on the fourth bit sequence by using the maximum-length interleaving sequence, to obtain a fifth bit sequence; and obtain the second bit sequence by removing the bits whose values are NULL from the fifth bit sequence.

In a possible design, the maximum-length interleaving sequence is any sequence in Table 1 in this specification.

In a possible design, the maximum-length interleaving sequence is any sequence in Table 2 in this specification.

For beneficial effects of the encoding apparatus provided in the second aspect and the possible designs of the second aspect, refer to the beneficial effects brought by the first aspect and the possible implementations of the first aspect. Details are not described herein again.

According to a third aspect, this application provides an encoding apparatus, including a memory and a processor, where the memory is configured to store a program instruction; and the processor is configured to invoke the program instruction in the memory, to perform the encoding method according to the first aspect and any possible design of the first aspect.

According to a fourth aspect, this application provides a readable storage medium, including a readable storage medium and a computer program, where the computer program is used to implement the method according to the first aspect and any possible design of the first aspect.

According to a fifth aspect, this application provides a program product, where the program product includes a computer program, the computer program is stored in a readable storage medium, at least one processor of an encoding apparatus may read the computer program from the readable storage medium, and the at least one processor executes the computer program, so that the encoding apparatus implements the method according to the first aspect and any possible design of the first aspect.

DESCRIPTION OF EMBODIMENTS

The embodiments of this application may be applied to a wireless communications system. It should be noted that the wireless communications system mentioned in the embodiments of this application includes but is not limited to a Narrowband Internet of Things (NB-IoT) system, the Global System for Mobile Communications (GSM), an Enhanced Data rates for GSM Evolution (EDGE) system, a Wideband Code Division Multiple Access (WCDMA) system, a Code Division Multiple Access 2000 (CDMA2000) system, a Time Division-Synchronous Code Division Multiple Access (TD-SCDMA) system, a Long Term Evolution (LTE) system, and three application scenarios in a next-generation 5G mobile communications system: the Enhanced Mobile Broadband eMBB), URLLC, and massive machine type communications (mMTC).

Communications apparatuses related in this application mainly include a network device and a terminal device. In this application, if a transmit end is the network device, a receive end is the terminal device. In this application, if a transmit end is the terminal device, a receive end is the network device.

In the embodiments of this application, the terminal device (terminal device) includes but is not limited to a mobile station (MS), a mobile terminal, a mobile telephone, a handset, a portable equipment, and the like. The terminal device may communicate with one or more core networks by using a radio access network (RAN). For example, the terminal device may be a mobile phone (or referred to as a "cellular" phone), or a computer with a wireless communication function. Alternatively, the terminal device may be a portable, pocket-sized, handheld, computer built-in, or in-vehicle mobile apparatus or device.

The embodiments are described in this application with reference to the network device. The network device may be a device configured to communicate with the terminal device. For example, the network device may be a base transceiver station (BTS) in the GSM system or CDMA, may be a NodeB (NB) in the WCDMA system, or may be an evolved NodeB (eNB or eNodeB) in the LTE system. Alternatively, the network device may be a relay station, an access point, an in-vehicle device, a wearable device, a network-side device in a future 5G network, a network device in a future evolved public land mobile network (Public Land Mobile Network, PLMN), or the like. Alternatively, the network device may be a terminal device responsible for a network device function during D2D communication.

Figure 1:
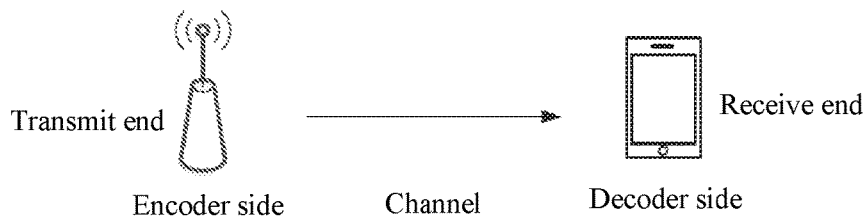
FIG. 1 is a schematic diagram of a system architecture including a transmit end and a receive end according to this application.

A communications system in this application may include a transmit end and a receive end. FIG. 1 is a schematic diagram of a system architecture including a transmit end and a receive end according to this application. As shown in FIG. 1, the transmit end is an encoder side, and may be configured to perform encoding and output encoded information. The encoded information is transmitted to a decoder side on a channel. The receive end is the decoder side, and may be configured to: receive the encoded information sent by the transmit end, and decode the encoded information.

Figure 2:
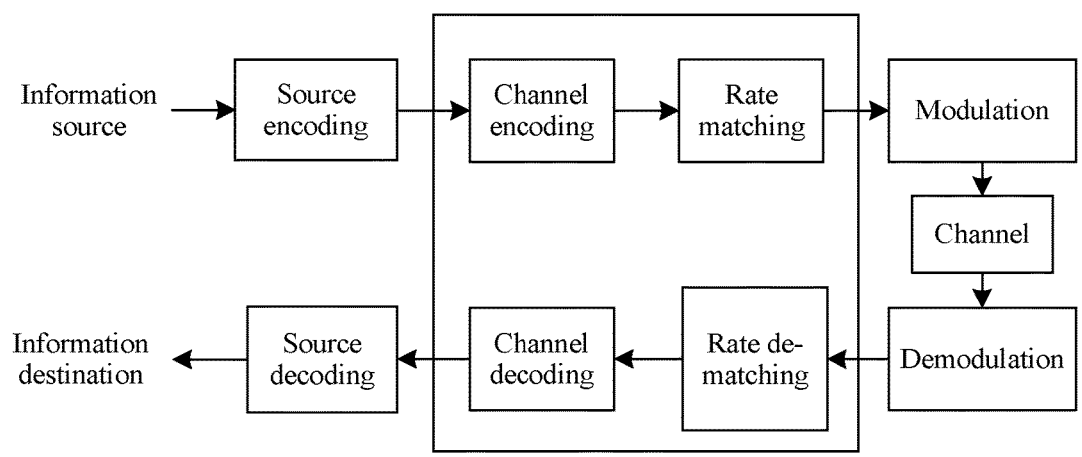
FIG. 2 is a schematic flowchart of a communications system.

FIG. 2 is a schematic flowchart of a communications system. As shown in FIG. 2, at a transmit end, a signal source sequentially undergoes signal source encoding, channel encoding, interleaving, rate matching, and digital modulation. At a receive end, the signal source sequentially undergoes digital demodulation, rate de-matching, channel decoding, and signal source decoding, and is output to a signal sink. A polar code or a CA-polar code may be used for the channel encoding/decoding. An encoding method provided in this application may be used for the channel encoding.

This application provides an encoding method and apparatus, so that during distributed CRC encoding, when an information bit quantity is less than a maximum information bit quantity, an interleaving sequence required for completing an interleaving process is obtained based on a system-supported maximum-length interleaving sequence, and better performance can be ensured. For example, an encoding delay is reduced, and a false alarm probability is decreased. An information bit quantity corresponding to the system-supported maximum-length interleaving sequence is the maximum information bit quantity. The encoding method and apparatus that are provided in this application are described below in detail with reference to the accompanying drawings.

It should be noted that, to complete an interleaving function, there are two numbering manners for an interleaving sequence: information bits are numbered in natural order, or information bits are numbered in reverse order (briefly referred to as natural-order numbering and reverse-order numbering below). The natural-order numbering means that a ranking of an index of a corresponding information bit in an interleaving sequence is the same as a ranking of the index of the information bit; to be specific, an index 0 corresponds to a 0th information bit, an index 1 corresponds to a first information bit, and so on. The reverse-order numbering means that a ranking of an index of a corresponding information bit in an interleaving sequence is reverse to a ranking of the index of the information bit; to be specific, an index 0 corresponds to the last information bit, an index 1 corresponds to the penultimate information bit, and so on.

In addition, a minimum index of the interleaving sequence related in the embodiments of this application is 0. If a minimum index of an actually used interleaving sequence is 1, the method in this application may be simply adjusted. In all examples in this application, an interleaving sequence starts with an index 0. During actual application, if an interleaving sequence starts with an index 1, each corresponding index is increased by 1.

Figure 3:
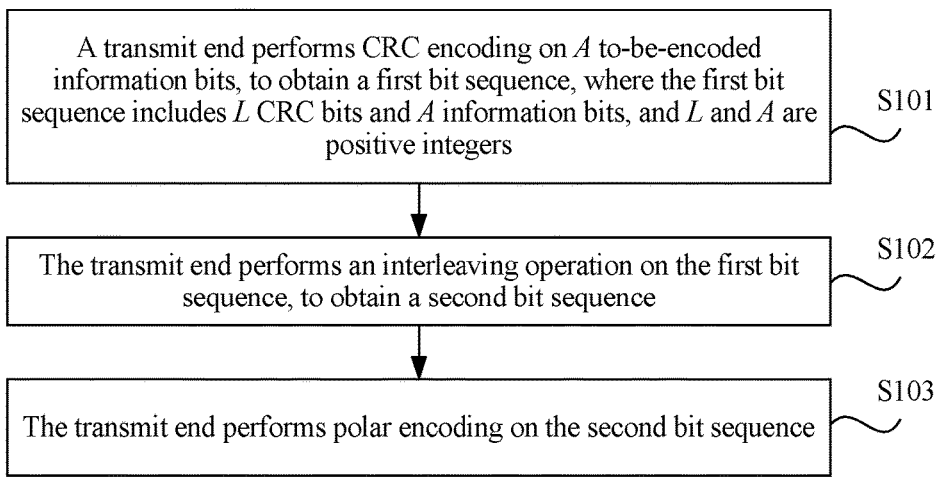
FIG. 3 is a flowchart of an embodiment of an encoding method according to this application.

FIG. 3 is a flowchart of an embodiment of an encoding method according to this application. As shown in FIG. 3, this embodiment is performed by a transmit end (an encoder). The method in this embodiment may include the following steps.

S101. The transmit end performs CRC encoding on A to-be-encoded information bits, to obtain a first bit sequence, where the first bit sequence includes L CRC bits and A information bits, and L and A are positive integers.

Specifically, after receiving the A to-be-encoded information bits, the transmit end adds the L CRC bits, to obtain the first bit sequence.

S102. The transmit end performs an interleaving operation on the first bit sequence, to obtain a second bit sequence.

Two types of interleaving sequences are used for the interleaving operation: a first interleaving sequence and a second interleaving sequence. Different interleaving sequences correspond to different interleaving operations. The first interleaving sequence is obtained based on a system-supported maximum-length interleaving sequence and a preset rule, and a length of the first interleaving sequence is equal to A+L. The second interleaving sequence is the maximum-length interleaving sequence, a length of the second interleaving sequence is equal to $K_{max}+L$, and $K_{max}$ is a maximum information bit quantity corresponding to the maximum-length interleaving sequence. The system-supported maximum-length interleaving sequence is briefly referred to as the maximum-length interleaving sequence below.

The system-supported maximum-length interleaving sequence may be pre-stored, or may be obtained through online calculation.

The first interleaving sequence may be obtained in two manners that respectively correspond to two types of preset rules.

In Manner 1, the preset rule is: the first interleaving sequence is constituted by sequentially extracting all indexes greater than or equal to $K_{max}-A$ from the maximum-length interleaving sequence and subtracting $K_{max}-A$ from each of all the extracted indexes. For example, the maximum-length interleaving sequence is {2, 3, 5, 9, 10, 12, 4, 6, 11, 13, 0, 7, 14, 1, 8, 15}, the maximum information bit quantity $K_{max}$ corresponding to the maximum-length interleaving sequence is equal to 12, L=4, A=10, and $K_{max}-A=2$. All indexes {2, 3, 5, 9, 10, 12, 4, 6, 11, 13, 7, 14, 8, 15} greater than or equal to 2 are first sequentially extracted from the maximum-length interleaving sequence, and 2 is subtracted from each of all the extracted indexes, to constitute the first interleaving sequence {0, 1, 3, 7, 8, 10, 2, 4, 9, 11, 5, 12, 6, 13}.

Correspondingly, the performing, by the transmit end, an interleaving operation on the first bit sequence may be specifically: performing, by the transmit end, the interleaving operation on the first bit sequence by using the first interleaving sequence, to obtain the second bit sequence.

In Manner 1, natural-order numbering is used for the maximum-length interleaving sequence.

In Manner 2, the preset rule is: the first interleaving sequence is constituted by sequentially extracting all indexes less than A or greater than or equal to $K_{max}$ from the maximum-length interleaving sequence and subtracting $K_{max}-A$ from indexes greater than or equal to $K_{max}$ in the extracted indexes. For example, the maximum-length interleaving sequence is {1, 2, 6, 8, 9, 12, 0, 5, 7, 13, 4, 11, 14, 3, 10, 15}, the maximum information bit quantity $K_{max}$ corresponding to the maximum-length interleaving sequence is equal to 12, L=4, A=10, and $K_{max}-A=2$. All indexes {1, 2, 6, 8, 9, 12, 0, 5, 7, 13, 4, 14, 3, 15} less than 10 or greater than or equal to 12 are first sequentially extracted from the maximum-length interleaving sequence, and 2 is subtracted from indexes greater than or equal to 12 in the extracted indexes, to constitute the first interleaving sequence {1, 2, 6, 8, 9, 10, 0, 5, 7, 11, 4, 12, 3, 13}.

Correspondingly, the performing, by the transmit end, an interleaving operation on the first bit sequence may be specifically: arranging, by the transmit end, the A information bits in the first bit sequence in descending order of information bit indexes, to obtain a third bit sequence. Arrangement in descending order is also referred to as arrangement in reverse order. For example, the first bit sequence is {0, 1, 2, 3, 4, 5, 6, 7, 8, 9, 10, 11, 12, 13, 14}, {0, 1, 2, 3, 4, 5, 6, 7, 8, 9, 10} are the information bits, and {11, 12, 13, 14} are the CRC bits. {10, 9, 8, 7, 6, 5, 4, 3, 2, 1, 0} is obtained after the information bits are arranged in reverse order, and the obtained third bit sequence is {10, 9, 8, 7, 6, 5, 4, 3, 2, 1, 0, 11, 12, 13, 14}. Then, the transmit end performs the interleaving operation on the third bit sequence by using the first interleaving sequence, to obtain the second bit sequence.

In Manner 2, reverse-order numbering is used for the maximum-length interleaving sequence.

The maximum-length interleaving sequence may be directly used as the second interleaving sequence. Correspondingly, the performing, by the transmit end, an interleaving operation on the first bit sequence may be specifically:

extending, by the transmit end, the first bit sequence to a fourth bit sequence including $K_{max}+L$ bits, where values of first $K_{max}-A$ bits in the fourth bit sequence are set to NULL, and remaining bits sequentially correspond to the bits in the first bit sequence from a $(K_{max}-A+1)^{th}$ bit.

For example, $K_{max}=12$, L=4, A=10, and $K_{max}-A=2$. The transmit end extends the first bit sequence (including four CRC bits and 10 information bits) to the fourth bit sequence including 12+4=16 bits. Values of first two bits in the fourth bit sequence are set to NULL, and remaining bits sequentially correspond to the bits in the first bit sequence from a third bit.

The transmit end performs the interleaving operation on the fourth bit sequence by using the maximum-length interleaving sequence, to obtain a fifth bit sequence.

The transmit end obtain the second bit sequence by removing the bits whose values are NULL from the fifth bit sequence.

When the interleaving operation is performed by using the second interleaving sequence, the first bit sequence needs to be extended before the interleaving, and after the interleaving, the bits whose values are NULL need to be removed from the interleaved bit sequence. Therefore, an interleaving operation delay is relatively long. In comparison with performing the interleaving operation by using the second interleaving sequence, when the interleaving operation is performed by using the first interleaving sequence, parallel processing may be used during an operation of obtaining the first interleaving sequence based on the maximum-length interleaving sequence and the preset rule, and after the first interleaving sequence is obtained, the second bit sequence may be directly obtained by performing the interleaving operation by using the first interleaving sequence, so that a delay can be reduced, thereby reducing an encoding delay.

In this manner, natural-order numbering is used for the maximum-length interleaving sequence.

S103. The transmit end performs polar encoding on the second bit sequence.

The transmit end may perform polar encoding on the second bit sequence by using an existing polar encoding method. Details are not described herein.

According to the encoding method provided in this embodiment, the transmit end performs CRC encoding on the A to-be-encoded information bits, to obtain the first bit sequence, and then performs the interleaving operation on the first bit sequence, to obtain the second bit sequence. The first interleaving sequence used for the interleaving operation is obtained based on the maximum-length interleaving sequence and the preset rule, and the length of the first interleaving sequence corresponds to the quantity of to-be-encoded information bits. Alternatively, the second interleaving sequence used for the interleaving operation is directly the maximum-length interleaving sequence. Finally, the transmit end performs polar encoding on the second bit sequence. Therefore, during distributed CRC encoding, when an information bit quantity is less than the maximum information bit quantity, an interleaving sequence required for completing an interleaving process is obtained based on the system-supported maximum-length interleaving sequence.

The technical solutions in the method embodiment shown in FIG. 3 are described in detail below by using several specific embodiments.

Figure 4:
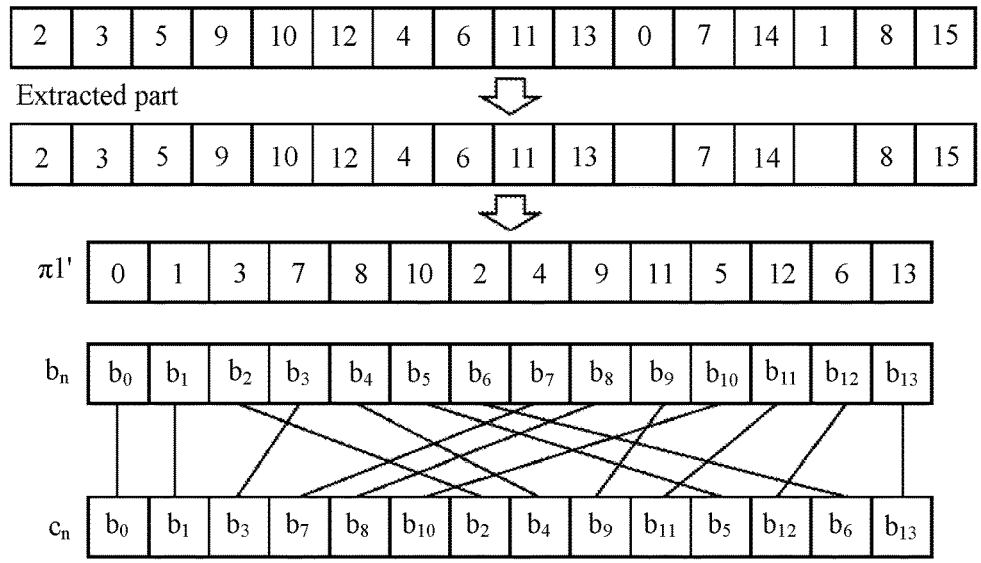
FIG. 4 is a schematic flowchart of an encoding method according to this application.

FIG. 4 is a schematic flowchart of an encoding method according to this application. In this embodiment, for example, an interleaving sequence used for an interleaving operation is the first interleaving sequence obtained based on the preset rule in Manner 1, a maximum-length interleaving sequence used for distributed CRC encoding is a sequence η1 for which natural-order numbering is used, a maximum information bit length corresponding to the interleaving sequence π1 is $K_{max}$, a CRC polynomial is g, and a CRC bit quantity is L. In other words, a CRC length is L. It is assumed that A to-be-encoded information bits are $\{a_0, a_1, \ldots, a_{A-1}\}$, and the information bit quantity $A \leq K_{max}$. This embodiment is performed by a transmit end (an encoder). As shown in FIG. 4, the method in this embodiment includes the following steps.

S201. Perform CRC encoding on A to-be-encoded information bits, to obtain a first bit sequence $\{b_0, b_1, \ldots, b_{A+L-1}\}$.

$\{b_0, b_1, \ldots, b_{A-1}\}$ are A information bits, and $\{b_A, b_{A+1}, \ldots, b_{A+L-1}\}$ are L CRC bits.

S202. the first interleaving sequence π1' is constituted by sequentially extracting all indexes less than A or greater than or equal to $K_{max}$ from the maximum-length interleaving sequence and subtracting $K_{max}-A$ from indexes greater than or equal to $K_{max}$ in the extracted indexes For example, as shown in FIG. 4, if the maximum-length interleaving sequence π1 is {2, 3, 5, 9, 10, 12, 4, 6, 11, 13, 0, 7, 14, 1, 8, 15}, L=4, and A=10, a maximum information bit quantity $K_{max}$ corresponding to the maximum-length interleaving sequence is equal to 12, and $K_{max}-A=2$. All indexes greater than or equal to 2 are first sequentially extracted from π1, and an extracted part is {2, 3, 5, 9, 10, 12, 4, 6, 11, 13, 7, 14, 8, 15}. Then, 2 is subtracted from each of all the extracted indexes, to constitute the first interleaving sequence π1' {0, 1, 3, 7, 8, 10, 2, 4, 9, 11, 5, 12, 6, 13}.

S203. Perform an interleaving operation on the first bit sequence $\{b_0, b_1, \ldots, b_{A+L-1}\}$ by using the first interleaving sequence π1', to obtain a second bit sequence $\{c_0, c_1, \ldots, c_{A+L-1}\}$.

Specifically, the first bit sequence shown in FIG. 4 is $\{b_0, b_1, \ldots, b_{13}\}$. After the interleaving operation is performed on the first bit sequence $\{b_0, b_1, b_2, b_3, b_4, b_5, b_6, b_7, b_8, b_9, b_{10}, b_{11}, b_{12}, b_{13}\}$ by using the first interleaving sequence π1' {0, 1, 3, 7, 8, 10, 2, 4, 9, 11, 5, 12, 6, 13}, the second bit sequence is obtained.

S204. Perform polar encoding on the second bit sequence.

In this embodiment, as shown in the following Table 1, for an interleaving sequence in Table 1, different CRC polynomials and corresponding interleaving sequences for which natural-order numbering is used are provided for different CRC lengths L and different maximum information bit quantities $K_{max}$.

TABLE 1

| $K_{max}$ | L | CRC polynomial | Interleaving sequence for which natural-order numbering is used |
|---|---|---|---|
| 200 | 19 | 0xA2B79 | 0, 1, 2, 5, 6, 7, 10, 11, 13, 14, 18, 19, 20, 22, 23, 24, 26, 31, 33, 35, 37, 39, 42, 44, 45, 47, 51, 52, 55, 56, 57, 58, 60, 61, 62, 64, 67, 69, 70, 72, 73, 76, 85, 86, 89, 90, 93, 94, 100, 103, 104, 105, 107, 109, 110, 112, 113, 125, 127, 128, 129, 130, 131, 133, 134, 137, 140, 144, 145, 148, 149, 152, 159, 161, 162, 163, 166, 169, 173, 175, 178, 182, 183, 186, 187, 189, 195, 196, 197, 200, 3, 4, 8, 9, 12, 15, 16, 21, 25, 28, 41, 46, 49, 53, 54, 59, 63, 66, 71, 74, 75, 78, 87, 88, 91, 92, 95, 96, 102, 106, 111, 114, 115, 132, 135, 136, 139, 142, 146, 147, 150, 151, 154, 164, 165, 168, 171, 177, 180, 184, 185, 188, 191, 198, 199, 202, 17, 27, 29, 34, 36, 38, 40, 48, 50, 65, 79, 97, 108, 116, 143, 155, 172, 176, 181, 190, 192, 203, 32, 43, 68, 77, 80, 98, 99, 101, 118, 121, 122, 126, 156, 160, 170, 179, 194, 209, 81, 119, 123, 138, 153, 157, 210, 82, 117, 120, 124, 141, 158, 167, 174, 193, 211, 30, 83, 212, 84, 201, 204, 205, 206, 207, 208, 213, 214, 215, 216, 217, 218 |

TABLE 1-continued

| $K_{max}$ | L | CRC polynomial | Interleaving sequence for which natural-order numbering is used |
|---|---|---|---|
| 200 | 19 | 0xA2B79 | 197, 196, 195, 189, 187, 186, 183, 182, 178, 175, 173, 169, 166, 163, 162, 161, 159, 152, 149, 148, 145, 144, 140, 137, 134, 133, 131, 130, 129, 128, 127, 125, 113, 112, 110, 109, 107, 105, 104, 103, 100, 94, 93, 90, 89, 86, 85, 76, 73, 72, 70, 69, 67, 64, 62, 61, 60, 58, 57, 56, 55, 52, 51, 47, 45, 44, 42, 39, 37, 35, 33, 31, 26, 24, 23, 22, 20, 19, 18, 14, 13, 11, 10, 7, 6, 5, 2, 1, 0, 200, 199, 198, 191, 188, 185, 184, 180, 177, 171, 168, 165, 164, 154, 151, 150, 147, 146, 142, 139, 136, 135, 132, 115, 114, 111, 106, 102, 96, 95, 92, 91, 88, 87, 78, 75, 74, 71, 66, 63, 59, 54, 53, 49, 46, 41, 28, 25, 21, 16, 15, 12, 9, 8, 4, 3, 202, 192, 190, 181, 176, 172, 155, 143, 116, 108, 97, 79, 65, 50, 48, 40, 38, 36, 34, 29, 27, 17, 203, 194, 179, 170, 160, 156, 126, 122, 121, 118, 101, 99, 98, 80, 77, 68, 43, 32, 209, 157, 153, 138, 123, 119, 81, 210, 193, 174, 167, 158, 141, 124, 120, 117, 82, 211, 83, 30, 212, 84, 201, 204, 205, 206, 207, 208, 213, 214, 215, 216, 217, 218 |
| 200 | 19 | 0xA2B79 | 0, 1, 2, 3, 4, 7, 8, 9, 12, 13, 15, 16, 20, 21, 22, 24, 25, 26, 28, 33, 35, 37, 39, 41, 44, 46, 47, 49, 53, 54, 57, 58, 59, 60, 62, 63, 64, 66, 69, 71, 72, 74, 75, 78, 87, 88, 91, 92, 95, 96, 102, 105, 106, 107, 109, 111, 112, 114, 115, 127, 129, 130, 131, 132, 133, 135, 136, 139, 142, 146, 147, 150, 151, 154, 161, 163, 164, 165, 168, 171, 175, 177, 180, 184, 185, 188, 189, 191, 197, 198, 199, 202, 6, 11, 17, 18, 19, 27, 29, 31, 34, 36, 38, 40, 48, 50, 51, 52, 56, 65, 79, 85, 86, 90, 94, 97, 100, 104, 108, 116, 125, 143, 144, 145, 149, 155, 159, 172, 173, 176, 181, 182, 183, 187, 190, 192, 195, 196, 203, 23, 32, 43, 55, 61, 68, 76, 81, 89, 93, 98, 99, 101, 103, 110, 117, 118, 126, 134, 137, 140, 141, 148, 152, 157, 160, 169, 170, 179, 186, 194, 205, 5, 14, 30, 67, 77, 82, 119, 128, 138, 153, 158, 162, 174, 193, 206, 10, 70, 80, 121, 122, 156, 209, 42, 120, 123, 124, 167, 178, 211, 45, 83, 166, 212, 73, 84, 113, 200, 201, 204, 207, 208, 210, 213, 214, 215, 216, 217, 218 |
| 200 | 19 | 0xA2B79 | 199, 198, 197, 191, 189, 188, 185, 184, 180, 177, 175, 171, 168, 165, 164, 163, 161, 154, 151, 150, 147, 146, 142, 139, 136, 135, 133, 132, 131, 130, 129, 127, 115, 114, 112, 111, 109, 107, 106, 105, 102, 96, 95, 92, 91, 88, 87, 78, 75, 74, 72, 71, 69, 66, 64, 63, 62, 60, 59, 58, 57, 54, 53, 49, 47, 46, 44, 41, 39, 37, 35, 33, 28, 26, 25, 24, 22, 21, 20, 16, 15, 13, 12, 9, 8, 7, 4, 3, 2, 1, 0, 202, 196, 195, 192, 190, 187, 183, 182, 181, 176, 173, 172, 159, 155, 149, 145, 144, 143, 125, 116, 108, 104, 100, 97, 94, 90, 86, 85, 79, 65, 56, 52, 51, 50, 48, 40, 38, 36, 34, 31, 29, 27, 19, 18, 17, 11, 6, 203, 194, 186, 179, 170, 169, 160, 157, 152, 148, 141, 140, 137, 134, 126, 118, 117, 110, 103, 101, 99, 98, 93, 89, 81, 76, 68, 61, 55, 43, 32, 23, 205, 193, 174, 162, 158, 153, 138, 128, 119, 82, 77, 67, 30, 14, 5, 206, 156, 122, 121, 80, 70, 10, 209, 178, 167, 124, 123, 120, 42, 211, 166, 83, 45, 212, 73, 84, 113, 200, 201, 204, 207, 208, 210, 213, 214, 215, 216, 217, 218 |
| 200 | 19 | 0xA2B79 | 3, 4, 6, 7, 8, 9, 11, 16, 17, 18, 19, 20, 21, 24, 25, 27, 29, 31, 33, 34, 35, 36, 37, 38, 39, 40, 44, 48, 50, 51, 52, 54, 56, 57, 59, 62, 63, 65, 69, 75, 79, 85, 86, 88, 90, 92, 94, 96, 97, 100, 104, 105, 106, 108, 109, 115, 116, 125, 127, 129, 132, 136, 143, 144, 145, 147, 149, 151, 155, 159, 161, 163, 164, 165, 172, 173, 175, 176, 181, 182, 183, 185, 187, 190, 192, 195, 196, 197, 198, 199, 203, 0, 1, 2, 12, 13, 14, 23, 28, 30, 32, 41, 42, 47, 49, 53, 61, 66, 67, 72, 73, 80, 87, 91, 95, 98, 101, 103, 112, 113, 117, 126, 131, 134, 140, 146, 150, 156, 160, 169, 174, 177, 178, 184, 188, 189, 191, 193, 204, 15, 43, 55, 58, 60, 68, 74, 76, 81, 89, 93, 99, 102, 110, 114, 118, 133, 135, 137, 141, 148, 152, 157, 170, 179, 186, 194, 205, 5, 22, 77, 82, 107, 111, 119, 128, 138, 142, 153, 158, 162, 171, 180, 206, 10, 26, 45, 64, 70, 78, 84, 120, 121, 139, 167, 208, 71, 122, 123, 130, 166, 210, 46, 83, 213, 124, 154, 168, 200, 201, 202, 207, 209, 211, 212, 214, 215, 216, 217, 218 |
| 200 | 19 | 0xA2B79 | 199, 198, 197, 196, 195, 192, 190, 187, 185, 183, 182, 181, 176, 175, 173, 172, 165, 164, 163, 161, 159, 155, 151, 149, 147, 145, 144, 143, 136, 132, 129, 127, 125, 116, 115, 109, 108, 106, 105, 104, 100, 97, 96, 94, 92, 90, 88, 86, 85, 79, 75, 69, 65, 63, 62, 59, 57, 56, 54, 52, 51, 50, 48, 44, 40, 39, 38, 37, 36, 35, 34, 33, 31, 29, 27, 25, 24, 21, 20, 19, 18, 17, 16, 11, 9, 8, 7, 6, 4, 3, 203, 193, 191, 189, 188, 184, 178, 177, 174, 169, 160, 156, 150, 146, 140, 134, 131, 126, 117, 113, 112, 103, 101, 98, 95, 91, 87, 80, 73, 72, 67, 66, 61, 53, 49, 47, 42, 41, 32, 30, 28, 23, 14, 13, 12, 2, 1, 0, 204, 194, 186, 179, 170, 157, 152, 148, 141, 137, 135, 133, 118, 114, 110, 102, 99, 93, 89, 81, 76, 74, 68, 60, 58, 55, 43, 15, 205, 180, 171, 162, 158, 153, 142, 138, 128, 119, 111, 107, 82, 77, 22, 5, 206, 167, 139, 121, 120, 84, 78, 70, 64, 45, 26, 10, 208, 166, 130, 123, 122, 71, 210, 83, 46, 213, 124, 154, 168, 200, 201, 202, 207, 209, 211, 212, 214, 215, 216, 217, 218 |
| 200 | 20 | 0x191513 | 2, 3, 6, 10, 11, 15, 17, 18, 19, 21, 26, 27, 31, 32, 33, 36, 38, 40, 42, 44, 45, 48, 49, 50, 51, 53, 54, 58, 61, 62, 68, 69, 72, 73, 78, |

TABLE 1-continued

| $K_{max}$ | L | CRC polynomial | Interleaving sequence for which natural-order numbering is used |
|---|---|---|---|
| 200 | 20 | 0x191513 | 80, 81, 83, 85, 88, 89, 90, 93, 94, 95, 96, 100, 101, 103, 105, 107, 108, 110, 111, 112, 114, 115, 116, 118, 121, 124, 126, 127, 130, 132, 133, 134, 139, 140, 141, 142, 143, 144, 146, 148, 149, 153, 154, 155, 156, 158, 160, 161, 164, 169, 176, 178, 179, 180, 181, 184, 185, 186, 188, 189, 193, 195, 197, 198, 199, 200, 0, 4, 7, 12, 16, 20, 22, 28, 34, 37, 39, 41, 43, 46, 52, 55, 59, 63, 70, 74, 79, 82, 84, 86, 91, 97, 102, 104, 106, 109, 113, 117, 119, 122, 125, 128, 131, 135, 145, 147, 150, 157, 159, 162, 165, 170, 177, 182, 187, 190, 194, 196, 201, 1, 5, 8, 13, 23, 29, 35, 47, 56, 60, 64, 71, 75, 87, 92, 98, 120, 123, 129, 136, 151, 163, 166, 171, 183, 191, 202, 9, 14, 24, 30, 57, 65, 76, 99, 137, 152, 167, 172, 192, 203, 25, 66, 77, 138, 168, 173, 204, 67, 174, 205, 175, 206, 207, 208, 209, 210, 211, 212, 213, 214, 215, 216, 217, 218, 219 |
| 200 | 20 | 0x191513 | 199, 198, 197, 195, 193, 189, 188, 186, 185, 184, 181, 180, 179, 178, 176, 169, 164, 161, 160, 158, 156, 155, 154, 153, 149, 148, 146, 144, 143, 142, 141, 140, 139, 134, 133, 132, 130, 127, 126, 124, 121, 118, 116, 115, 114, 112, 111, 110, 108, 107, 105, 103, 101, 100, 96, 95, 94, 93, 90, 89, 88, 85, 83, 81, 80, 78, 73, 72, 69, 68, 62, 61, 58, 54, 53, 51, 50, 49, 48, 45, 44, 42, 40, 38, 36, 33, 32, 31, 27, 26, 21, 19, 18, 17, 15, 11, 10, 6, 3, 2, 200, 196, 194, 190, 187, 182, 177, 170, 165, 162, 159, 157, 150, 147, 145, 135, 131, 128, 125, 122, 119, 117, 113, 109, 106, 104, 102, 97, 91, 86, 84, 82, 79, 74, 70, 63, 59, 55, 52, 46, 43, 41, 39, 37, 34, 28, 22, 20, 16, 12, 7, 4, 0, 201, 191, 183, 171, 166, 163, 151, 136, 129, 123, 120, 98, 92, 87, 75, 71, 64, 60, 56, 47, 35, 29, 23, 13, 8, 5, 1, 202, 192, 172, 167, 152, 137, 99, 76, 65, 57, 30, 24, 14, 9, 203, 173, 168, 138, 77, 66, 25, 204, 174, 67, 205, 175, 206, 207, 208, 209, 210, 211, 212, 213, 214, 215, 216, 217, 218, 219 |
| 200 | 21 | 0x2E2A69 | 1, 5, 6, 8, 9, 10, 12, 14, 15, 17, 19, 21, 23, 26, 27, 28, 29, 30, 32, 33, 35, 39, 41, 47, 49, 51, 52, 53, 55, 58, 59, 60, 61, 63, 66, 69, 72, 74, 76, 78, 79, 83, 87, 88, 89, 94, 96, 97, 101, 103, 105, 108, 109, 110, 111, 113, 114, 118, 125, 127, 131, 133, 134, 135, 136, 137, 138, 141, 142, 147, 150, 151, 156, 159, 160, 162, 163, 164, 168, 170, 171, 172, 173, 174, 177, 180, 181, 182, 184, 188, 190, 195, 197, 200, 0, 2, 7, 11, 13, 16, 18, 20, 22, 24, 31, 34, 36, 40, 42, 48, 50, 54, 56, 62, 64, 67, 70, 73, 75, 77, 80, 84, 90, 95, 98, 102, 104, 106, 112, 115, 119, 126, 128, 132, 139, 143, 148, 152, 157, 161, 165, 169, 175, 178, 183, 185, 189, 191, 196, 198, 201, 3, 25, 37, 43, 57, 65, 68, 71, 81, 85, 91, 99, 107, 116, 120, 129, 140, 144, 149, 153, 158, 166, 176, 179, 186, 192, 199, 202, 4, 38, 44, 82, 86, 92, 100, 117, 121, 130, 145, 154, 167, 187, 193, 203, 45, 93, 122, 146, 155, 194, 204, 46, 123, 205, 124, 206, 207, 208, 209, 210, 211, 212, 213, 214, 215, 216, 217, 218, 219, 220 |
| 200 | 21 | 0x2E2A69 | 197, 195, 190, 188, 184, 182, 181, 180, 177, 174, 173, 172, 171, 170, 168, 164, 163, 162, 160, 159, 156, 151, 150, 147, 142, 141, 138, 137, 136, 135, 134, 133, 131, 127, 125, 118, 114, 113, 111, 110, 109, 108, 105, 103, 101, 97, 96, 94, 89, 88, 87, 83, 79, 78, 76, 74, 72, 69, 66, 63, 61, 60, 59, 58, 55, 53, 52, 51, 49, 47, 41, 39, 35, 33, 32, 30, 29, 28, 27, 26, 23, 21, 19, 17, 15, 14, 12, 10, 9, 8, 6, 5, 1, 200, 198, 196, 191, 189, 185, 183, 178, 175, 169, 165, 161, 157, 152, 148, 143, 139, 132, 128, 126, 119, 115, 112, 106, 104, 102, 98, 95, 90, 84, 80, 77, 75, 73, 70, 67, 64, 62, 56, 54, 50, 48, 42, 40, 36, 34, 31, 24, 22, 20, 18, 16, 13, 11, 7, 2, 0, 201, 199, 192, 186, 179, 176, 166, 158, 153, 149, 144, 140, 129, 120, 116, 107, 99, 91, 85, 81, 71, 68, 65, 57, 43, 37, 25, 3, 202, 193, 187, 167, 154, 145, 130, 121, 117, 100, 92, 86, 82, 44, 38, 4, 203, 194, 155, 146, 122, 93, 45, 204, 123, 46, 205, 124, 206, 207, 208, 209, 210, 211, 212, 213, 214, 215, 216, 217, 218, 219, 220 |
| 200 | 22 | 0x552A55 | 1, 2, 3, 4, 12, 14, 15, 17, 19, 20, 22, 24, 27, 30, 34, 35, 36, 37, 38, 39, 40, 41, 44, 45, 48, 49, 50, 51, 52, 56, 57, 58, 60, 61, 62, 65, 67, 68, 69, 72, 74, 75, 76, 80, 81, 82, 84, 85, 86, 87, 92, 93, 95, 102, 105, 106, 107, 108, 110, 111, 113, 116, 117, 119, 121, 122, 125, 129, 130, 131, 132, 134, 136, 138, 141, 142, 147, 148, 149, 150, 152, 159, 161, 165, 169, 170, 171, 172, 174, 175, 180, 182, 183, 185, 189, 190, 191, 192, 198, 200, 5, 13, 16, 18, 21, 23, 25, 28, 31, 42, 46, 53, 59, 63, 66, 70, 73, 77, 83, 88, 94, 96, 103, 109, 112, 114, 118, 120, 123, 126, 133, 135, 137, 139, 143, 151, 153, 160, 162, 166, 173, 176, 181, 184, 186, 193, 199, 201, 6, 26, 29, 32, 43, 47, 54, 64, 71, 78, 89, 97, 104, 115, 124, 127, 140, 144, 154, 163, 167, 177, 187, 194, 202, 0, 7, 33, 55, 79, 90, 98, 128, 145, 155, 164, 168, 178, 188, 195, 203, 8, 91, 99, 146, 156, 179, 196, 204, 9, 100, 157, 197, 205, 10, 101, 158, 206, 11, 207, 208, 209, 210, 211, 212, 213, 214, 215, 216, 217, 218, 219, 220, 221 |
| 200 | 22 | 0x552A55 | 198, 192, 191, 190, 189, 185, 183, 182, 180, 175, 174, 172, 171, 170, 169, 165, 161, 159, 152, 150, 149, 148, 147, 142, 141, 138, |

TABLE 1-continued

| $K_{max}$ | L | CRC polynomial | Interleaving sequence for which natural-order numbering is used |
|---|---|---|---|
| | | | 136, 134, 132, 131, 130, 129, 125, 122, 121, 119, 117, 116, 113, 111, 110, 108, 107, 106, 105, 102, 95, 93, 92, 87, 86, 85, 84, 82, 81, 80, 76, 75, 74, 72, 69, 68, 67, 65, 62, 61, 60, 58, 57, 56, 52, 51, 50, 49, 48, 45, 44, 41, 40, 39, 38, 37, 36, 35, 34, 30, 27, 24, 22, 20, 19, 17, 15, 14, 12, 4, 3, 2, 1, 200, 199, 193, 186, 184, 181, 176, 173, 166, 162, 160, 153, 151, 143, 139, 137, 135, 133, 126, 123, 120, 118, 114, 112, 109, 103, 96, 94, 88, 83, 77, 73, 70, 66, 63, 59, 53, 46, 42, 31, 28, 25, 23, 21, 18, 16, 13, 5, 201, 194, 187, 177, 167, 163, 154, 144, 140, 127, 124, 115, 104, 97, 89, 78, 71, 64, 54, 47, 43, 32, 29, 26, 6, 202, 195, 188, 178, 168, 164, 155, 145, 128, 98, 90, 79, 55, 33, 7, 0, 203, 196, 179, 156, 146, 99, 91, 8, 204, 197, 157, 100, 9, 205, 158, 101, 10, 206, 11, 207, 208, 209, 210, 211, 212, 213, 214, 215, 216, 217, 218, 219, 220, 221 |
| 200 | 23 | 0x86F4A1 | 1, 3, 4, 5, 11, 12, 13, 14, 18, 20, 23, 24, 25, 28, 30, 31, 32, 33, 37, 39, 42, 45, 46, 47, 49, 50, 51, 53, 55, 57, 59, 60, 61, 64, 65, 67, 69, 70, 71, 72, 73, 74, 75, 77, 80, 83, 84, 85, 86, 87, 88, 89, 90, 93, 94, 99, 101, 102, 104, 106, 109, 111, 112, 113, 115, 116, 119, 121, 123, 124, 133, 134, 135, 137, 139, 140, 141, 142, 144, 145, 148, 149, 152, 153, 154, 157, 159, 162, 164, 166, 168, 169, 175, 176, 178, 179, 180, 181, 182, 187, 188, 193, 195, 200, 0, 2, 6, 15, 19, 21, 26, 29, 34, 38, 40, 43, 48, 52, 54, 56, 58, 62, 66, 68, 76, 78, 81, 91, 95, 100, 103, 105, 107, 110, 114, 117, 120, 122, 125, 136, 138, 143, 146, 150, 155, 158, 160, 163, 165, 167, 170, 177, 183, 189, 194, 196, 201, 7, 16, 22, 27, 35, 41, 44, 63, 79, 82, 92, 96, 108, 118, 126, 147, 151, 156, 161, 171, 184, 190, 197, 202, 8, 17, 36, 97, 127, 172, 185, 191, 198, 203, 9, 98, 128, 173, 186, 192, 199, 204, 10, 129, 174, 205, 130, 206, 131, 207, 132, 208, 209, 210, 211, 212, 213, 214, 215, 216, 217, 218, 219, 220, 221, 222 |
| 200 | 23 | 0x86F4A1 | 195, 193, 188, 187, 182, 181, 180, 179, 178, 176, 175, 169, 168, 166, 164, 162, 159, 157, 154, 153, 152, 149, 148, 145, 144, 142, 141, 140, 139, 137, 135, 134, 133, 124, 123, 121, 119, 116, 115, 113, 112, 111, 109, 106, 104, 102, 101, 99, 94, 93, 90, 89, 88, 87, 86, 85, 84, 83, 80, 77, 75, 74, 73, 72, 71, 70, 69, 67, 65, 64, 61, 60, 59, 57, 55, 53, 51, 50, 49, 47, 46, 45, 42, 39, 37, 33, 32, 31, 30, 28, 25, 24, 23, 20, 18, 14, 13, 12, 11, 5, 4, 3, 1, 200, 196, 194, 189, 183, 177, 170, 167, 165, 163, 160, 158, 155, 150, 146, 143, 138, 136, 125, 122, 120, 117, 114, 110, 107, 105, 103, 100, 95, 91, 81, 78, 76, 68, 66, 62, 58, 56, 54, 52, 48, 43, 40, 38, 34, 29, 26, 21, 19, 15, 6, 2, 0, 201, 197, 190, 184, 171, 161, 156, 151, 147, 126, 118, 108, 96, 92, 82, 79, 63, 44, 41, 35, 27, 22, 16, 7, 202, 198, 191, 185, 172, 127, 97, 36, 17, 8, 203, 199, 192, 186, 173, 128, 98, 9, 204, 174, 129, 10, 205, 130, 206, 131, 207, 132, 208, 209, 210, 211, 212, 213, 214, 215, 216, 217, 218, 219, 220, 221, 222 |
| 200 | 24 | 0x1D11A9B | 0, 2, 3, 5, 6, 8, 11, 12, 13, 16, 19, 20, 22, 24, 28, 32, 33, 35, 37, 38, 39, 40, 41, 42, 44, 46, 47, 49, 50, 54, 55, 57, 59, 60, 62, 64, 67, 69, 74, 79, 80, 84, 85, 86, 88, 91, 94, 102, 105, 109, 110, 111, 113, 114, 116, 118, 119, 121, 122, 125, 126, 127, 129, 130, 131, 132, 136, 137, 141, 142, 143, 147, 148, 149, 151, 153, 155, 158, 161, 164, 166, 168, 170, 171, 173, 175, 178, 179, 180, 182, 183, 186, 187, 189, 192, 194, 198, 199, 200, 1, 4, 7, 9, 14, 17, 21, 23, 25, 29, 34, 36, 43, 45, 48, 51, 56, 58, 61, 63, 65, 68, 70, 75, 81, 87, 89, 92, 95, 103, 106, 112, 115, 117, 120, 123, 128, 133, 138, 144, 150, 152, 154, 156, 159, 162, 165, 167, 169, 172, 174, 176, 181, 184, 188, 190, 193, 195, 201, 10, 15, 18, 26, 30, 52, 66, 71, 76, 82, 90, 93, 96, 104, 107, 124, 134, 139, 145, 157, 160, 163, 177, 185, 191, 196, 202, 27, 31, 53, 72, 77, 83, 97, 108, 135, 140, 146, 197, 203, 73, 78, 98, 204, 99, 205, 100, 206, 101, 207, 208, 209, 210, 211, 212, 213, 214, 215, 216, 217, 218, 219, 220, 221, 222, 223 |
| 200 | 24 | 0x1D11A9B | 199, 198, 194, 192, 189, 187, 186, 183, 182, 180, 179, 178, 175, 173, 171, 170, 168, 166, 164, 161, 158, 155, 153, 151, 149, 148, 147, 143, 142, 141, 137, 136, 132, 131, 130, 129, 127, 126, 125, 122, 121, 119, 118, 116, 114, 113, 111, 110, 109, 105, 102, 94, 91, 88, 86, 85, 84, 80, 79, 74, 69, 67, 64, 62, 60, 59, 57, 55, 54, 50, 49, 47, 46, 44, 42, 41, 40, 39, 38, 37, 35, 33, 32, 28, 24, 22, 20, 19, 16, 13, 12, 11, 8, 6, 5, 3, 2, 0, 200, 195, 193, 190, 188, 184, 181, 176, 174, 172, 169, 167, 165, 162, 159, 156, 154, 152, 150, 144, 138, 133, 128, 123, 120, 117, 115, 112, 106, 103, 95, 92, 89, 87, 81, 75, 70, 68, 65, 63, 61, 58, 56, 51, 48, 45, 43, 36, 34, 29, 25, 23, 21, 17, 14, 9, 7, 4, 1, 201, 196, 191, 185, 177, 163, 160, 157, 145, 139, 134, 124, 107, 104, 96, 93, 90, 82, 76, 71, 66, 52, 30, 26, 18, 15, 10, 202, 197, 146, 140, 135, 108, 97, 83, 77, 72, 53, 31, 27, 203, 98, 78, 73, 204, 99, 205, 100, 206, 101, 207, 208, 209, 210, 211, 212, 213, 214, 215, 216, 217, 218, 219, 220, 221, 222, 223 |

TABLE 1-continued

| $K_{max}$ | L | CRC polynomial | Interleaving sequence for which natural-order numbering is used |
|---|---|---|---|
| 1000 | 11 | 0x94F | 0, 1, 4, 5, 6, 8, 13, 14, 15, 17, 18, 22, 24, 26, 29, 30, 32, 33, 34, 38, 39, 40, 43, 44, 47, 50, 52, 53, 58, 59, 62, 63, 65, 67, 72, 73, 75, 76, 78, 79, 82, 85, 86, 88, 89, 90, 91, 95, 97, 100, 104, 105, 108, 112, 113, 115, 116, 118, 124, 126, 127, 128, 129, 130, 132, 133, 134, 135, 141, 142, 145, 147, 148, 149, 151, 153, 154, 156, 159, 161, 164, 167, 168, 169, 170, 173, 175, 176, 177, 181, 185, 189, 191, 193, 194, 195, 196, 198, 200, 202, 203, 205, 207, 211, 212, 213, 214, 215, 217, 218, 222, 223, 224, 228, 230, 231, 232, 233, 234, 235, 236, 237, 239, 240, 241, 243, 245, 246, 247, 248, 250, 251, 252, 255, 256, 267, 270, 272, 273, 275, 279, 280, 281, 282, 285, 288, 289, 290, 292, 295, 297, 299, 300, 302, 303, 306, 307, 309, 314, 320, 322, 324, 325, 330, 335, 336, 343, 346, 347, 348, 349, 350, 351, 352, 353, 356, 357, 358, 359, 360, 362, 364, 366, 369, 370, 371, 372, 373, 376, 377, 378, 380, 385, 386, 387, 389, 390, 394, 396, 398, 401, 402, 404, 405, 406, 410, 411, 412, 415, 416, 419, 422, 424, 425, 430, 431, 434, 435, 437, 439, 444, 445, 447, 448, 450, 451, 454, 457, 458, 460, 461, 462, 463, 467, 469, 472, 476, 477, 480, 484, 485, 487, 488, 490, 496, 498, 499, 500, 501, 502, 504, 505, 506, 507, 513, 514, 517, 519, 520, 521, 523, 525, 526, 528, 531, 533, 536, 539, 540, 541, 542, 545, 547, 548, 549, 553, 557, 561, 563, 565, 566, 567, 568, 570, 572, 574, 575, 577, 579, 583, 584, 585, 586, 587, 589, 590, 594, 595, 596, 600, 602, 603, 604, 605, 606, 607, 608, 609, 611, 612, 613, 615, 617, 618, 619, 620, 622, 623, 624, 627, 628, 639, 642, 644, 645, 647, 651, 652, 653, 654, 657, 660, 661, 662, 664, 667, 669, 671, 672, 674, 675, 678, 679, 681, 686, 692, 694, 696, 697, 702, 707, 708, 715, 718, 719, 720, 721, 722, 723, 724, 725, 728, 729, 730, 731, 732, 734, 736, 738, 741, 742, 743, 744, 745, 748, 749, 750, 752, 757, 758, 759, 761, 762, 766, 768, 770, 773, 774, 776, 777, 778, 782, 783, 784, 787, 788, 791, 794, 796, 797, 802, 803, 806, 807, 809, 811, 816, 817, 819, 820, 822, 823, 826, 829, 830, 832, 833, 834, 835, 839, 841, 844, 848, 849, 852, 856, 857, 859, 860, 862, 868, 870, 871, 872, 873, 874, 876, 877, 878, 879, 885, 886, 889, 891, 892, 893, 895, 897, 898, 900, 903, 905, 908, 911, 912, 913, 914, 917, 919, 920, 921, 925, 929, 933, 935, 937, 938, 939, 940, 942, 944, 946, 947, 949, 951, 955, 956, 957, 958, 959, 961, 962, 966, 967, 968, 972, 974, 975, 976, 977, 978, 979, 980, 981, 983, 984, 985, 987, 989, 990, 991, 992, 994, 995, 996, 999, 1000, 2, 7, 9, 16, 19, 23, 25, 27, 31, 35, 41, 45, 48, 51, 54, 60, 64, 66, 68, 74, 77, 80, 83, 87, 92, 96, 98, 101, 106, 109, 114, 117, 119, 125, 131, 136, 143, 146, 150, 152, 155, 157, 160, 162, 165, 171, 174, 178, 182, 186, 190, 192, 197, 199, 201, 204, 206, 208, 216, 219, 225, 229, 238, 242, 244, 249, 253, 257, 268, 271, 274, 276, 283, 286, 291, 293, 296, 298, 301, 304, 308, 310, 315, 321, 323, 326, 331, 337, 344, 354, 361, 363, 365, 367, 374, 379, 381, 388, 391, 395, 397, 399, 403, 407, 413, 417, 420, 423, 426, 432, 436, 438, 440, 446, 449, 452, 455, 459, 464, 468, 470, 473, 478, 481, 486, 489, 491, 497, 503, 508, 515, 518, 522, 524, 527, 529, 532, 534, 537, 543, 546, 550, 554, 558, 562, 564, 569, 571, 573, 576, 578, 580, 588, 591, 597, 601, 610, 614, 616, 621, 625, 629, 640, 643, 646, 648, 655, 658, 663, 665, 668, 670, 673, 676, 680, 682, 687, 693, 695, 698, 703, 709, 716, 726, 733, 735, 737, 739, 746, 751, 753, 760, 763, 767, 769, 771, 775, 779, 785, 789, 792, 795, 798, 804, 808, 810, 812, 818, 821, 824, 827, 831, 836, 840, 842, 845, 850, 853, 858, 861, 863, 869, 875, 880, 887, 890, 894, 896, 899, 901, 904, 906, 909, 915, 918, 922, 926, 930, 934, 936, 941, 943, 945, 948, 950, 952, 960, 963, 969, 973, 982, 986, 988, 993, 997, 1001, 3, 10, 20, 28, 36, 42, 46, 49, 55, 61, 69, 81, 84, 93, 99, 102, 107, 110, 120, 137, 144, 158, 163, 166, 172, 179, 183, 187, 209, 220, 226, 254, 258, 269, 277, 284, 287, 294, 305, 311, 316, 327, 332, 338, 345, 355, 368, 375, 382, 392, 400, 408, 414, 418, 421, 427, 433, 441, 453, 456, 465, 471, 474, 479, 482, 492, 509, 516, 530, 535, 538, 544, 551, 555, 559, 581, 592, 598, 626, 630, 641, 649, 656, 659, 666, 677, 683, 688, 699, 704, 710, 717, 727, 740, 747, 754, 764, 772, 780, 786, 790, 793, 799, 805, 813, 825, 828, 837, 843, 846, 851, 854, 864, 881, 888, 902, 907, 910, 916, 923, 927, 931, 953, 964, 970, 998, 1002, 11, 21, 37, 56, 70, 94, 103, 111, 121, 138, 180, 184, 188, 210, 221, 227, 259, 278, 312, 317, 328, 333, 339, 383, 393, 409, 428, 442, 466, 475, 483, 493, 510, 552, 556, 560, 582, 593, 599, 631, 650, 684, 689, 700, 705, 711, 755, 765, 781, 800, 814, 838, 847, 855, 865, 882, 924, 928, 932, 954, 965, 971, 1003, 12, 57, 71, 122, 139, 260, 313, 318, 329, 334, 340, 384, 429, 443, 494, 511, 632, 685, 690, 701, 706, 712, 756, 801, 815, 866, 883, 1004, 123, 140, 261, 319, 341, 495, 512, 633, 691, 713, 867, 884, 1005, 262, 342, 634, 714, 1006, 263, 635, 1007, 264, 636, 1008, 265, 637, 1009, 266, 638, 1010 |

TABLE 1-continued

| $K_{max}$ | L | CRC polynomial | Interleaving sequence for which natural-order numbering is used |
|---|---|---|---|
| 1000 | 11 | 0x94F | 999, 996, 995, 994, 992, 991, 990, 989, 987, 985, 984, 983, 981, 980, 979, 978, 977, 976, 975, 974, 972, 968, 967, 966, 962, 961, 959, 958, 957, 956, 955, 951, 949, 947, 946, 944, 942, 940, 939, 938, 937, 935, 933, 929, 925, 921, 920, 919, 917, 914, 913, 912, 911, 908, 905, 903, 900, 898, 897, 895, 893, 892, 891, 889, 886, 885, 879, 878, 877, 876, 874, 873, 872, 871, 870, 868, 862, 860, 859, 857, 856, 852, 849, 848, 844, 841, 839, 835, 834, 833, 832, 830, 829, 826, 823, 822, 820, 819, 817, 816, 811, 809, 807, 806, 803, 802, 797, 796, 794, 791, 788, 787, 784, 783, 782, 778, 777, 776, 774, 773, 770, 768, 766, 762, 761, 759, 758, 757, 752, 750, 749, 748, 745, 744, 743, 742, 741, 738, 736, 734, 732, 731, 730, 729, 728, 725, 724, 723, 722, 721, 720, 719, 718, 715, 708, 707, 702, 697, 696, 694, 692, 686, 681, 679, 678, 675, 674, 672, 671, 669, 667, 664, 662, 661, 660, 657, 654, 653, 652, 651, 647, 645, 644, 642, 639, 628, 627, 624, 623, 622, 620, 619, 618, 617, 615, 613, 612, 611, 609, 608, 607, 606, 605, 604, 603, 602, 600, 596, 595, 594, 590, 589, 587, 586, 585, 584, 583, 579, 577, 575, 574, 572, 570, 568, 567, 566, 565, 563, 561, 557, 553, 549, 548, 547, 545, 542, 541, 540, 539, 536, 533, 531, 528, 526, 525, 523, 521, 520, 519, 517, 514, 513, 507, 506, 505, 504, 502, 501, 500, 499, 498, 496, 490, 488, 487, 485, 484, 480, 477, 476, 472, 469, 467, 463, 462, 461, 460, 458, 457, 454, 451, 450, 448, 447, 445, 444, 439, 437, 435, 434, 431, 430, 425, 424, 422, 419, 416, 415, 412, 411, 410, 406, 405, 404, 402, 401, 398, 396, 394, 390, 389, 387, 386, 385, 380, 378, 377, 376, 373, 372, 371, 370, 369, 366, 364, 362, 360, 359, 358, 357, 356, 353, 352, 351, 350, 349, 348, 347, 346, 343, 336, 335, 330, 325, 324, 322, 320, 314, 309, 307, 306, 303, 302, 300, 299, 297, 295, 292, 290, 289, 288, 285, 282, 281, 280, 279, 275, 273, 272, 270, 267, 256, 255, 252, 251, 250, 248, 247, 246, 245, 243, 241, 240, 239, 237, 236, 235, 234, 233, 232, 231, 230, 228, 224, 223, 222, 218, 217, 215, 214, 213, 212, 211, 207, 205, 203, 202, 200, 198, 196, 195, 194, 193, 191, 189, 185, 181, 177, 176, 175, 173, 170, 169, 168, 167, 164, 161, 159, 156, 154, 153, 151, 149, 148, 147, 145, 142, 141, 135, 134, 133, 132, 130, 129, 128, 127, 126, 124, 118, 116, 115, 113, 112, 108, 105, 104, 100, 97, 95, 91, 90, 89, 88, 86, 85, 82, 79, 78, 76, 75, 73, 72, 67, 65, 63, 62, 59, 58, 53, 52, 50, 47, 44, 43, 40, 39, 38, 34, 33, 32, 30, 29, 26, 24, 22, 18, 17, 15, 14, 13, 8, 6, 5, 4, 1, 0, 1000, 997, 993, 988, 986, 982, 973, 969, 963, 960, 952, 950, 948, 945, 943, 941, 936, 934, 930, 926, 922, 918, 915, 909, 906, 904, 901, 899, 896, 894, 890, 887, 880, 875, 869, 863, 861, 858, 853, 850, 845, 842, 840, 836, 831, 827, 824, 821, 818, 812, 810, 808, 804, 798, 795, 792, 789, 785, 779, 775, 771, 769, 767, 763, 760, 753, 751, 746, 739, 737, 735, 733, 726, 716, 709, 703, 698, 695, 693, 687, 682, 680, 676, 673, 670, 668, 665, 663, 658, 655, 648, 646, 643, 640, 629, 625, 621, 616, 614, 610, 601, 597, 591, 588, 580, 578, 576, 573, 571, 569, 564, 562, 558, 554, 550, 546, 543, 537, 534, 532, 529, 527, 524, 522, 518, 515, 508, 503, 497, 491, 489, 486, 481, 478, 473, 470, 468, 464, 459, 455, 452, 449, 446, 440, 438, 436, 432, 426, 423, 420, 417, 413, 407, 403, 399, 397, 395, 391, 388, 381, 379, 374, 367, 365, 363, 361, 354, 344, 337, 331, 326, 323, 321, 315, 310, 308, 304, 301, 298, 296, 293, 291, 286, 283, 276, 274, 271, 268, 257, 253, 249, 244, 242, 238, 229, 225, 219, 216, 208, 206, 204, 201, 199, 197, 192, 190, 186, 182, 178, 174, 171, 165, 162, 160, 157, 155, 152, 150, 146, 143, 136, 131, 125, 119, 117, 114, 109, 106, 101, 98, 96, 92, 87, 83, 80, 77, 74, 68, 66, 64, 60, 54, 51, 48, 45, 41, 35, 31, 27, 25, 23, 19, 16, 9, 7, 2, 1001, 998, 970, 964, 953, 931, 927, 923, 916, 910, 907, 902, 888, 881, 864, 854, 851, 846, 843, 837, 828, 825, 813, 805, 799, 793, 790, 786, 780, 772, 764, 754, 747, 740, 727, 717, 710, 704, 699, 688, 683, 677, 666, 659, 656, 649, 641, 630, 626, 598, 592, 581, 559, 555, 551, 544, 538, 535, 530, 516, 509, 492, 482, 479, 474, 471, 465, 456, 453, 441, 433, 427, 421, 418, 414, 408, 400, 392, 382, 375, 368, 355, 345, 338, 332, 327, 316, 311, 305, 294, 287, 284, 277, 269, 258, 254, 226, 220, 209, 187, 183, 179, 172, 166, 163, 158, 144, 137, 120, 110, 107, 102, 99, 93, 84, 81, 69, 61, 55, 49, 46, 42, 36, 28, 20, 10, 3, 1002, 971, 965, 954, 932, 928, 924, 882, 865, 855, 847, 838, 814, 800, 781, 765, 725, 711, 705, 700, 689, 684, 650, 631, 599, 593, 582, 560, 556, 552, 510, 493, 483, 475, 466, 442, 428, 409, 393, 383, 339, 333, 328, 317, 312, 278, 259, 227, 221, 210, 188, 184, 180, 138, 121, 111, 103, 94, 70, 56, 37, 21, 11, 1003, 883, 866, 815, 801, 756, 712, 706, 701, 690, 685, 632, 511, 494, 443, 429, 384, 340, 334, 329, 318, 313, 260, 139, 122, 71, 57, 12, 1004, 884, 867, 713, 691, 633, 512, 495, 341, 319, 261, 140, 123, 1005, 714, 634, 342, 262, 1006, 635, 263, 1007, 636, 264, 1008, 637, 265, 1009, 638, 266, 1010 |

TABLE 1-continued

| $K_{max}$ | L | CRC polynomial | Interleaving sequence for which natural-order numbering is used |
|---|---|---|---|
| 22 | 3 | 0xD | 1, 4, 5, 6, 8, 11, 12, 13, 0, 19, 2, 3, 15, 18, 20, 7, 9, 22, 10, 21, 16, 14, 23, 17, 24 |
| 22 | 3 | 0xD | 4, 5, 6, 8, 1, 12, 11, 13, 2, 19, 0, 3, 15, 18, 20, 7, 9, 22, 10, 21, 16, 14, 23, 17, 24 |
| 22 | 3 | 0xD | 1, 4, 5, 6, 8, 12, 11, 13, 0, 19, 2, 3, 15, 18, 20, 7, 9, 22, 10, 21, 16, 14, 23, 17, 24 |
| 22 | 3 | 0xD | 1, 4, 5, 6, 12, 11, 13, 8, 0, 19, 2, 3, 15, 18, 20, 7, 9, 22, 10, 21, 16, 14, 23, 17, 24 |

For example, L=19, the polynomial is 0xA2B79, and the interleaving sequence π1={0, 1, 2, 5, 6, 7, 10, 11, 13, 14, 18, 19, 20, 22, 23, 24, 26, 31, 33, 35, 37, 39, 42, 44, 45, 47, 51, 52, 55, 56, 57, 58, 60, 61, 62, 64, 67, 69, 70, 72, 73, 76, 85, 86, 89, 90, 93, 94, 100, 103, 104, 105, 107, 109, 110, 112, 113, 125, 127, 128, 129, 130, 131, 133, 134, 137, 140, 144, 145, 148, 149, 152, 159, 161, 162, 163, 166, 169, 173, 175, 178, 182, 183, 186, 187, 189, 195, 196, 197, 200, 3, 8, 12, 15, 21, 25, 27, 32, 34, 36, 38, 40, 43, 46, 48, 53, 59, 63, 65, 68, 71, 74, 77, 87, 91, 95, 101, 106, 108, 111, 114, 126, 132, 135, 138, 141, 146, 150, 153, 160, 164, 167, 170, 174, 176, 179, 184, 188, 190, 198, 201, 4, 9, 16, 28, 41, 49, 54, 66, 75, 78, 88, 92, 96, 102, 115, 136, 139, 142, 147, 151, 154, 165, 168, 171, 177, 180, 185, 191, 199, 202, 17, 29, 50, 79, 97, 116, 143, 155, 172, 181, 192, 203, 30, 80, 98, 117, 156, 193, 204, 81, 99, 118, 157, 194, 205, 82, 119, 158, 206, 83, 120, 207, 84, 121, 208, 122, 209, 123, 210, 124, 211, 212, 213, 214, 215, 216, 217, 218}. For example, if a length A of a current information bit sequence is equal to 64, a bit sequence obtained after CRC encoding is $\{b_0, b_1, \ldots, b_{82}\}$. A currently required interleaving sequence π1'={1, 4, 8, 9, 12, 13, 16, 23, 25, 26, 27, 30, 33, 37, 39, 42, 46, 47, 50, 51, 53, 59, 60, 61, 64, 2, 5, 10, 14, 17, 24, 28, 31, 34, 38, 40, 43, 48, 52, 54, 62, 65, 0, 3, 6, 11, 15, 18, 29, 32, 35, 41, 44, 49, 55, 63, 66, 7, 19, 36, 45, 56, 67, 20, 57, 68, 21, 58, 69, 22, 70, 71, 72, 73, 74, 75, 76, 77, 78, 79, 80, 81, 82} is extracted from the interleaving sequence π1 based on S202. The sequence $\{b_0, b_1, \ldots, b_{82}\}$ is interleaved based on S203, to obtain $\{c_0, c_1, \ldots, c_{82}\} = \{b_1, b_4, b_8, b_9, b_{12}, b_{13}, b_{16}, b_{23}, b_{25}, b_{26}, b_{27}, b_{30}, b_{33}, b_{37}, b_{39}, b_{42}, b_{46}, b_{47}, b_{50}, b_{51}, b_{53}, b_{59}, b_{60}, b_{61}, b_{64}, b_2, b_5, b_{10}, b_{14}, b_{17}, b_{24}, b_{28}, b_{31}, b_{34}, b_{38}, b_{40}, b_{43}, b_{48}, b_{52}, b_{54}, b_{62}, b_{65}, b_0, b_3, b_6, b_{11}, b_{15}, b_{18}, b_{29}, b_{32}, b_{35}, b_{41}, b_{44}, b_{49}, b_{55}, b_{63}, b_{66}, b_7, b_{19}, b_{36}, b_{45}, b_{56}, b_{67}, b_{20}, b_{57}, b_{68}, b_{21}, b_{58}, b_{69}, b_{22}, b_{70}, b_{71}, b_{72}, b_{73}, b_{74}, b_{75}, b_{76}, b_{77}, b_{78}, b_{79}, b_{80}, b_{81}, b_{82}\}$.

In Table 1, when $K_{max}=200$, L=19, and the CRC polynomial is 0xA2B79, there are six corresponding interleaving sequences for which natural-order numbering is used. A better early termination effect is achieved when a first interleaving sequence, a third interleaving sequence, or a fifth interleaving sequence is used for a low code-rate polar code. A better early termination effect is achieved when a second interleaving sequence, a fourth interleaving sequence, or a sixth interleaving sequence is used for a high code-rate polar code. A better early termination effect is achieved when a first interleaving sequence or a second interleaving sequence is used for polar code SC decoding. A better early termination effect is achieved when a third interleaving sequence or a fourth interleaving sequence is used for a polar code with a long code length. A better early termination effect is achieved when a fifth interleaving sequence or a sixth interleaving sequence is used for a polar code with a short code length.

When $K_{max}=200$, L=20, and the CRC polynomial is 0x191513, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}=200$, L=21, and the CRC polynomial is 0x2E2A69, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}=200$, L=22, and the CRC polynomial is 0x552A55, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}=200$, L=23, and the CRC polynomial is 0x86F4A1, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}=200$, L=24, and the CRC polynomial is 0x1D11A9B, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}$1000, L=11, and the CRC polynomial is 0x94F, there are two corresponding interleaving sequences for which natural-order numbering is used. A better early termination effect is achieved when a first interleaving sequence is used for a low code-rate polar code. A better early termination effect is achieved when a second interleaving sequence is used for a high code-rate polar code.

When $K_{max}$22, L=3, and the CRC polynomial is 0xD, there are four corresponding interleaving sequences for which natural-order numbering is used. A better early termination effect is achieved when a first interleaving sequence is used for a polar code whose code length is 32 after encoding. A better early termination effect is achieved when a second interleaving sequence is used for a polar code whose code length is 64 after encoding. A better early termination effect is achieved when a third interleaving sequence is used for a polar code whose code length is 128 after encoding. A better early termination effect is achieved when a fourth interleaving sequence is used for a polar code whose code length is 256 after encoding.

It should be noted that hexadecimal bit-reversed and explicit +1 notation is used for the CRC polynomial in Table 1 and a CRC polynomial in the following Table 2. For example, a polynomial 0xA2B79 corresponds to a binary polynomial (1, 0, 0, 1, 1, 1, 1, 0, 1, 1, 0, 1, 0, 1, 0, 0, 0, 1, 0, 1), and corresponds to a polynomial $D^{\wedge}9+D^{\wedge}6+D^{\wedge}15+D^{\wedge}14+D^{\wedge}3+D^{\wedge}11+D^{\wedge}10+D^{\wedge}8+D^{\wedge}6+D^{\wedge}2+1$.

Figure 5:
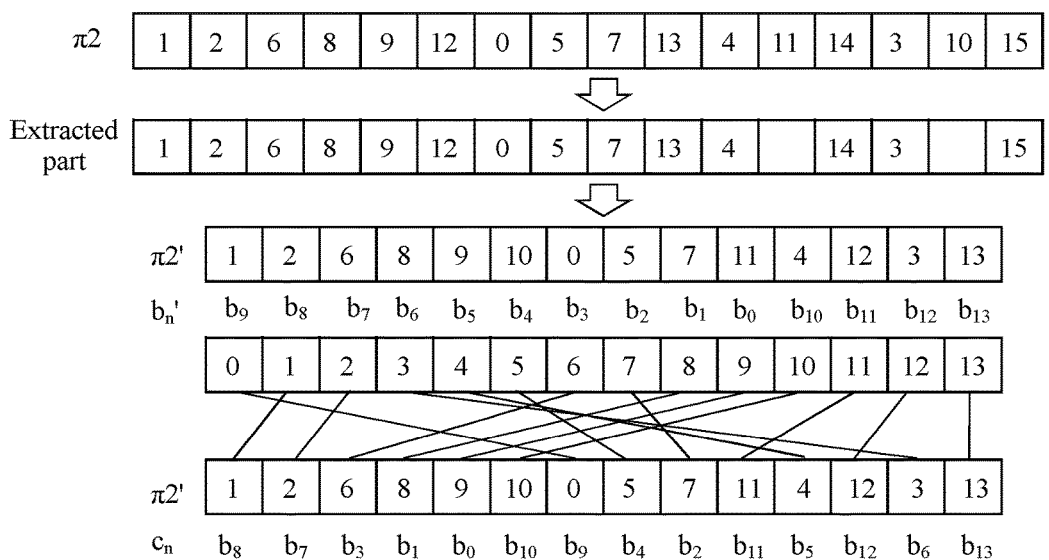
FIG. 5 is a schematic flowchart of an encoding method according to this application.

FIG. 5 is a schematic flowchart of an encoding method according to this application. In this embodiment, for example, an interleaving sequence used for an interleaving operation is the first interleaving sequence obtained based on the preset rule in Manner 2, a maximum-length interleaving sequence used for distributed CRC encoding is a sequence π2 for which reverse-order numbering is used, a maximum information bit length corresponding to π2 is $K_{max}$, a CRC polynomial is g, and a CRC bit quantity is L. In other words, a CRC length is L. It is assumed that A to-be-encoded information bits are $\{a_0, a_1, \ldots, a_{A-1}\}$, and the information bit quantity $A \leq K_{max}$. This embodiment is performed by a transmit end (an encoder). As shown in FIG. 5, the method in this embodiment includes the following steps.

S301. Perform CRC encoding on A to-be-encoded information bits, to obtain a first bit sequence $\{b_0, b_1, \ldots, b_{A+L-1}\}$.

$\{b_0, b_1, \ldots, b_{A-1}\}$ are A information bits, and $\{b_A, b_{A+1}, \ldots, b_{A+L-1}\}$ are L CRC bits.

S302. the first interleaving sequence π2' is constituted by sequentially extracting all indexes less than A or greater than or equal to $K_{max}$ from the maximum-length interleaving sequence and subtracting $K_{max}$–A from indexes greater than or equal to $K_{max}$ in the extracted indexes For example, as shown in FIG. 5, if the maximum-length interleaving sequence π2 is {1, 2, 6, 8, 9, 12, 0, 5, 7, 13, 4, 11, 14, 3, 10, 15}, L=4, and A=10, a maximum information bit quantity $K_{max}$ corresponding to the maximum-length interleaving sequence is equal to 12, and $K_{max}$–A=2. All indexes less than 10 or greater than or equal to 12 are first sequentially extracted from π2, and an extracted part is {1, 2, 6, 8, 9, 12, 0, 5, 7, 13, 4, 14, 3, 15}. Then, 2 is subtracted from indexes greater than or equal to 12 in the extracted indexes, to constitute the first interleaving sequence π2' {1, 2, 6, 8, 9, 10, 0, 5, 7, 11, 4, 12, 3, 13}.

S303. Arrange A information bits in the first bit sequence in descending order of information bit indexes, to obtain a third bit sequence.

Specifically, the A information bits in the first bit sequence $\{b_0, b_1, \ldots, b_{A+L-1}\}$ are arranged in descending order of the information bit indexes, to obtain the third bit sequence $\{b_0', b_1', \ldots, b_{A+L-1}'\}$. When k=0, 1, ..., A–1, $b_k'=b_{A-1-k}$. When k=A, A+1, ..., A+L–1, $b_k'=b_k$.

S304. Perform an interleaving operation on the third bit sequence $\{b_0', b_1', \ldots, b_{A+L-1}'\}$ by using the first interleaving sequence π2', to obtain a second bit sequence.

Specifically, the first bit sequence shown in FIG. 5 is $\{b_0, b_1, \ldots, b_{13}\}$. 10 information bits in the first bit sequence $\{b_0, b_1, \ldots, b_{13}\}$ are arranged in descending order of information bit indexes, to obtain the third bit sequence $\{b_9, b_8, b_7, b_6, b_5, b_4, b_3, b_2, b_1, b_0, b_{10}, b_{11}, b_{12}, b_{13}\}$. The second bit sequence obtained after the interleaving operation is performed on the third bit sequence $\{b_9, b_8, b_7, b_6, b_5, b_4, b_3, b_2, b_1, b_0, b_{10}, b_{11}, b_{12}, b_{13}\}$ by using the first interleaving sequence π2' {1, 2, 6, 8, 9, 10, 0, 5, 7, 11, 4, 12, 3, 13} is $\{b_8, b_7, b_3, b_1, b_0, b_{10}, b_9, b_4, b_2, b_{11}, b_5, b_{12}, b_6, b_{13}\}$.

S305. Perform polar encoding on the second bit sequence.

In this embodiment, as shown in the following Table 2, for an interleaving sequence in Table 2, different CRC polynomials and corresponding interleaving sequences for which reverse-order numbering is used are provided for different CRC lengths L and different maximum information bit quantities $K_{max}$.

TABLE 2

| $K_{max}$ | L | CRC polynomial | Interleaving sequence for which reverse-order numbering is used |
|---|---|---|---|
| 200 | 19 | 0xA2B79 | 2, 3, 4, 10, 12, 13, 16, 17, 21, 24, 26, 30, 33, 36, 37, 38, 40, 47, 50, 51, 54, 55, 59, 62, 65, 66, 68, 69, 70, 71, 72, 74, 86, 87, 89, 90, 92, 94, 95, 96, 99, 105, 106, 109, 110, 113, 114, 123, 126, 127, 129, 130, 132, 135, 137, 138, 139, 141, 142, 143, 144, 147, 148, 152, 154, 155, 157, 160, 162, 164, 166, 168, 173, 175, 176, 177, 179, 180, 181, 185, 186, 188, 189, 192, 193, 194, 197, 198, 199, 200, 0, 1, 8, 11, 14, 15, 19, 22, 28, 31, 34, 35, 45, 48, 49, 52, 53, 57, 60, 63, 64, 67, 84, 85, 88, 93, 97, 103, 104, 107, 108, 111, 112, 121, 124, 125, 128, 133, 136, 140, 145, 146, 150, 153, 158, 171, 174, 178, 183, 184, 187, 190, 191, 195, 196, 202, 7, 9, 18, 23, 27, 44, 56, 83, 91, 102, 120, 134, 149, 151, 159, 161, 163, 165, 170, 172, 182, 203, 5, 20, 29, 39, 43, 73, 77, 78, 81, 98, 100, 101, 119, 122, 131, 156, 167, 209, 42, 46, 61, 76, 80, 118, 210, 6, 25, 32, 41, 58, 75, 79, 82, 117, 211, 116, 169, 212, 115, 201, 204, 205, 206, 207, 208, 213, 214, 215, 216, 217, 218 |
| 200 | 19 | 0xA2B79 | 199, 198, 197, 194, 193, 192, 189, 188, 186, 185, 181, 180, 179, 177, 176, 175, 173, 168, 166, 164, 162, 160, 157, 155, 154, 152, 148, 147, 144, 143, 142, 141, 139, 138, 137, 135, 132, 130, 129, 127, 126, 123, 114, 113, 110, 109, 106, 105, 99, 96, 95, 94, 92, 90, 89, 87, 86, 74, 72, 71, 70, 69, 68, 66, 65, 62, 59, 55, 54, 51, 50, 47, 40, 38, 37, 36, 33, 30, 26, 24, 21, 17, 16, 13, 12, 10, 4, 3, 2, 200, 196, 195, 191, 190, 187, 184, 183, 178, 174, 171, 158, 153, 150, 146, 145, 140, 136, 133, 128, 125, 124, 121, 112, 111, 108, 107, 104, 103, 97, 93, 88, 85, 84, 67, 64, 63, 60, 57, 53, 52, 49, 48, 45, 35, 34, 31, 28, 22, 19, 15, 14, 11, 8, 1, 0, 202, 182, 172, 170, 165, 163, 161, 159, 151, 149, 134, 120, 102, 91, 83, 56, 44, 27, 23, 18, 9, 7, 203, 167, 156, 131, 122, 119, 101, 100, |

TABLE 2-continued

| $K_{max}$ | L | CRC polynomial | Interleaving sequence for which reverse-order numbering is used |
|---|---|---|---|
| | | | 98, 81, 78, 77, 73, 43, 39, 29, 20, 5, 209, 118, 80, 76, 61, 46, 42, 210, 117, 82, 79, 75, 58, 41, 32, 25, 6, 211, 169, 116, 212, 115, 201, 204, 205, 206, 207, 208, 213, 214, 215, 216, 217, 218 |
| 200 | 19 | 0xA2B79 | 0, 1, 2, 8, 10, 11, 14, 15, 19, 22, 24, 28, 31, 34, 35, 36, 38, 45, 48, 49, 52, 53, 57, 60, 63, 64, 66, 67, 68, 69, 70, 72, 84, 85, 87, 88, 90, 92, 93, 94, 97, 103, 104, 107, 108, 111, 112, 121, 124, 125, 127, 128, 130, 133, 135, 136, 137, 139, 140, 141, 142, 145, 146, 150, 152, 153, 155, 158, 160, 162, 164, 166, 171, 173, 174, 175, 177, 178, 179, 183, 184, 186, 187, 190, 191, 192, 195, 196, 197, 198, 199, 202, 3, 4, 7, 9, 12, 16, 17, 18, 23, 26, 27, 40, 44, 50, 54, 55, 56, 74, 83, 91, 95, 99, 102, 105, 109, 113, 114, 120, 134, 143, 147, 148, 149, 151, 159, 161, 163, 165, 168, 170, 172, 180, 181, 182, 188, 193, 203, 5, 13, 20, 29, 30, 39, 42, 47, 51, 58, 59, 62, 65, 73, 81, 82, 89, 96, 98, 100, 101, 106, 110, 118, 123, 131, 138, 144, 156, 167, 176, 205, 6, 25, 37, 41, 46, 61, 71, 80, 117, 122, 132, 169, 185, 194, 206, 43, 77, 78, 119, 129, 189, 209, 21, 32, 75, 76, 79, 157, 211, 33, 116, 154, 212, 86, 115, 126, 200, 201, 204, 207, 208, 210, 213, 214, 215, 216, 217, 218 |
| 200 | 19 | 0xA2B79 | 199, 198, 197, 196, 195, 192, 191, 190, 187, 186, 184, 183, 179, 178, 177, 175, 174, 173, 171, 166, 164, 162, 160, 158, 155, 153, 152, 150, 146, 145, 142, 141, 140, 139, 137, 136, 135, 133, 130, 128, 127, 125, 124, 121, 112, 111, 108, 107, 104, 103, 97, 94, 93, 92, 90, 88, 87, 85, 84, 72, 70, 69, 68, 67, 66, 64, 63, 60, 57, 53, 52, 49, 48, 45, 38, 36, 35, 34, 31, 28, 24, 22, 19, 15, 14, 11, 10, 8, 2, 1, 0, 202, 193, 188, 182, 181, 180, 172, 170, 168, 165, 163, 161, 159, 151, 149, 148, 147, 143, 134, 120, 114, 113, 109, 105, 102, 99, 95, 91, 83, 74, 56, 55, 54, 50, 44, 40, 27, 26, 23, 18, 17, 16, 12, 9, 7, 4, 3, 203, 176, 167, 156, 144, 138, 131, 123, 118, 110, 106, 101, 100, 98, 96, 89, 82, 81, 73, 65, 62, 59, 58, 51, 47, 42, 39, 30, 29, 20, 13, 5, 205, 194, 185, 169, 132, 122, 117, 80, 71, 61, 46, 41, 37, 25, 6, 206, 189, 129, 119, 78, 77, 43, 209, 157, 79, 76, 75, 32, 21, 211, 154, 116, 33, 212, 86, 115, 126, 200, 201, 204, 207, 208, 210, 213, 214, 215, 216, 217, 218 |
| 200 | 19 | 0xA2B79 | 0, 1, 2, 3, 4, 7, 9, 12, 14, 16, 17, 18, 23, 24, 26, 27, 34, 35, 36, 38, 40, 44, 48, 50, 52, 54, 55, 56, 63, 67, 70, 72, 74, 83, 84, 90, 91, 93, 94, 95, 99, 102, 103, 105, 107, 109, 111, 113, 114, 120, 124, 130, 134, 136, 137, 140, 142, 143, 145, 147, 148, 149, 151, 155, 159, 160, 161, 162, 163, 164, 165, 166, 168, 170, 172, 174, 175, 178, 179, 180, 181, 182, 183, 188, 190, 191, 192, 193, 195, 196, 203, 6, 8, 10, 11, 15, 21, 22, 25, 30, 39, 43, 49, 53, 59, 65, 68, 73, 82, 86, 87, 96, 98, 101, 104, 108, 112, 119, 126, 127, 132, 133, 138, 146, 150, 152, 157, 158, 167, 169, 171, 176, 185, 186, 187, 197, 198, 199, 204, 5, 13, 20, 29, 42, 47, 51, 58, 62, 64, 66, 81, 85, 89, 97, 100, 106, 110, 118, 123, 125, 131, 139, 141, 144, 156, 184, 205, 19, 28, 37, 41, 46, 57, 61, 71, 80, 88, 92, 117, 122, 177, 194, 206, 32, 60, 78, 79, 115, 121, 129, 135, 154, 173, 189, 208, 33, 69, 76, 77, 128, 210, 116, 153, 213, 31, 45, 75, 200, 201, 202, 207, 209, 211, 212, 214, 215, 216, 217, 218 |
| 200 | 19 | 0xA2B79 | 196, 195, 193, 192, 191, 190, 188, 183, 182, 181, 180, 179, 178, 175, 174, 172, 170, 168, 166, 165, 164, 163, 162, 161, 160, 159, 155, 151, 149, 148, 147, 145, 143, 142, 140, 137, 136, 134, 130, 124, 120, 114, 113, 111, 109, 107, 105, 103, 102, 99, 95, 94, 93, 91, 90, 84, 83, 74, 72, 70, 67, 63, 56, 55, 54, 52, 50, 48, 44, 40, 38, 36, 35, 34, 27, 26, 24, 23, 18, 17, 16, 14, 12, 9, 7, 4, 3, 2, 1, 0, 203, 199, 198, 197, 187, 186, 185, 176, 171, 169, 167, 158, 157, 152, 150, 146, 138, 133, 132, 127, 126, 119, 112, 108, 104, 101, 98, 96, 87, 86, 82, 73, 68, 65, 59, 53, 49, 43, 39, 30, 25, 22, 21, 15, 11, 10, 8, 6, 204, 184, 156, 144, 141, 139, 131, 125, 123, 118, 110, 106, 100, 97, 89, 85, 81, 66, 64, 62, 58, 51, 47, 42, 29, 20, 13, 5, 205, 194, 177, 122, 117, 92, 88, 80, 71, 61, 57, 46, 41, 37, 28, 19, 206, 189, 173, 154, 135, 129, 121, 115, 79, 78, 60, 32, 208, 128, 77, 76, 69, 33, 210, 153, 116, 213, 31, 45, 75, 200, 201, 202, 207, 209, 211, 212, 214, 215, 216, 217, 218 |
| 200 | 20 | 0x191513 | 0, 1, 2, 4, 6, 10, 11, 13, 14, 15, 18, 19, 20, 21, 23, 30, 35, 38, 39, 41, 43, 44, 45, 46, 50, 51, 53, 55, 56, 57, 58, 59, 60, 65, 66, 67, 69, 72, 73, 75, 78, 81, 83, 84, 85, 87, 88, 89, 91, 92, 94, 96, 98, 99, 103, 104, 105, 106, 109, 110, 111, 114, 116, 118, 119, 121, 126, 127, 130, 131, 137, 138, 141, 145, 146, 148, 149, 150, 151, 154, 155, 157, 159, 161, 163, 166, 167, 168, 172, 173, 178, 180, 181, 182, 184, 188, 189, 193, 196, 197, 200, 3, 5, 9, 12, 17, 22, 29, 34, 37, 40, 42, 49, 52, 54, 64, 68, 71, 74, 77, 80, 82, 86, 90, 93, 95, 97, 102, 108, 113, 115, 117, 120, 125, 129, 136, 140, 144, 147, 153, 156, 158, 160, 162, 165, 171, 177, 179, 183, 187, 192, 195, 199, 201, 8, 16, 28, 33, 36, 48, 63, 70, 76, 79, 101, 107, 112, 124, 128, 135, 139, 143, 152, 164, 170, 176, 186, 191, 194, 198, 202, 7, 27, 32, 47, 62, 100, 123, 134, 142, 169, 175, 185, 190, |

TABLE 2-continued

| $K_{max}$ | L | CRC polynomial | Interleaving sequence for which reverse-order numbering is used |
|---|---|---|---|
| 200 | 20 | 0x191513 | 203, 26, 31, 61, 122, 133, 174, 204, 25, 132, 205, 24, 206, 207, 208, 209, 210, 211, 212, 213, 214, 215, 216, 217, 218, 219 197, 196, 193, 189, 188, 184, 182, 181, 180, 178, 173, 172, 168, 167, 166, 163, 161, 159, 157, 155, 154, 151, 150, 149, 148, 146, 145, 141, 138, 137, 131, 130, 127, 126, 121, 119, 118, 116, 114, 111, 110, 109, 106, 105, 104, 103, 99, 98, 96, 94, 92, 91, 89, 88, 87, 85, 84, 83, 81, 78, 75, 73, 72, 69, 67, 66, 65, 60, 59, 58, 57, 56, 55, 53, 51, 50, 46, 45, 44, 43, 41, 39, 38, 35, 30, 23, 21, 20, 19, 18, 15, 14, 13, 11, 10, 6, 4, 2, 1, 0, 200, 199, 195, 192, 187, 183, 179, 177, 171, 165, 162, 160, 158, 156, 153, 147, 144, 140, 136, 129, 125, 120, 117, 115, 113, 108, 102, 97, 95, 93, 90, 86, 82, 80, 77, 74, 71, 68, 64, 54, 52, 49, 42, 40, 37, 34, 29, 22, 17, 12, 9, 5, 3, 201, 198, 194, 191, 186, 176, 170, 164, 152, 143, 139, 135, 128, 124, 112, 107, 101, 79, 76, 70, 63, 48, 36, 33, 28, 16, 8, 202, 190, 185, 175, 169, 142, 134, 123, 100, 62, 47, 32, 27, 7, 203, 174, 133, 122, 61, 31, 26, 204, 132, 25, 205, 24, 206, 207, 208, 209, 210, 211, 212, 213, 214, 215, 216, 217, 218, 219 |
| 200 | 21 | 0x2E2A69 | 2, 4, 9, 11, 15, 17, 18, 19, 22, 25, 26, 27, 28, 29, 31, 35, 36, 37, 39, 40, 43, 48, 49, 52, 57, 58, 61, 62, 63, 64, 65, 66, 68, 72, 74, 81, 85, 86, 88, 89, 90, 91, 94, 96, 98, 102, 103, 105, 110, 111, 112, 116, 120, 121, 123, 125, 127, 130, 133, 136, 138, 139, 140, 141, 144, 146, 147, 148, 150, 152, 158, 160, 164, 166, 167, 169, 170, 171, 172, 173, 176, 178, 180, 182, 184, 185, 187, 189, 190, 191, 193, 194, 198, 200, 1, 3, 8, 10, 14, 16, 21, 24, 30, 34, 38, 42, 47, 51, 56, 60, 67, 71, 73, 80, 84, 87, 93, 95, 97, 101, 104, 109, 115, 119, 122, 124, 126, 129, 132, 135, 137, 143, 145, 149, 151, 157, 159, 163, 165, 168, 175, 177, 179, 181, 183, 186, 188, 192, 197, 199, 201, 0, 7, 13, 20, 23, 33, 41, 46, 50, 55, 59, 70, 79, 83, 92, 100, 108, 114, 118, 128, 131, 134, 142, 156, 162, 174, 196, 202, 6, 12, 32, 45, 54, 69, 78, 82, 99, 107, 113, 117, 155, 161, 195, 203, 5, 44, 53, 77, 106, 154, 204, 76, 153, 205, 75, 206, 207, 208, 209, 210, 211, 212, 213, 214, 215, 216, 217, 218, 219, 220 |
| 200 | 21 | 0x2E2A69 | 198, 194, 193, 191, 190, 189, 187, 185, 184, 182, 180, 178, 176, 173, 172, 171, 170, 169, 167, 166, 164, 160, 158, 152, 150, 148, 147, 146, 144, 141, 140, 139, 138, 136, 133, 130, 127, 125, 123, 121, 120, 116, 112, 111, 110, 105, 103, 102, 98, 96, 94, 91, 90, 89, 88, 86, 85, 81, 74, 72, 68, 66, 65, 64, 63, 62, 61, 58, 57, 52, 49, 48, 43, 40, 39, 37, 36, 35, 31, 29, 28, 27, 26, 25, 22, 19, 18, 17, 15, 11, 9, 4, 2, 200, 199, 197, 192, 188, 186, 183, 181, 179, 177, 175, 168, 165, 163, 159, 157, 151, 149, 145, 143, 137, 135, 132, 129, 126, 124, 122, 119, 115, 109, 104, 101, 97, 95, 93, 87, 84, 80, 73, 71, 67, 60, 56, 51, 47, 42, 38, 34, 30, 24, 21, 16, 14, 10, 8, 3, 1, 201, 196, 174, 162, 156, 142, 134, 131, 128, 118, 114, 108, 100, 92, 83, 79, 70, 59, 55, 50, 46, 41, 33, 23, 20, 13, 7, 0, 202, 195, 161, 155, 117, 113, 107, 99, 82, 78, 69, 54, 45, 32, 12, 6, 203, 154, 106, 77, 53, 44, 5, 204, 153, 76, 205, 75, 206, 207, 208, 209, 210, 211, 212, 213, 214, 215, 216, 217, 218, 219, 220 |
| 200 | 22 | 0x552A55 | 1, 7, 8, 9, 10, 14, 16, 17, 19, 24, 25, 27, 28, 29, 30, 34, 38, 40, 47, 49, 50, 51, 52, 57, 58, 61, 63, 65, 67, 68, 69, 70, 74, 77, 78, 80, 82, 83, 86, 88, 89, 91, 92, 93, 94, 97, 104, 106, 107, 112, 113, 114, 115, 117, 118, 119, 123, 124, 125, 127, 130, 131, 132, 134, 137, 138, 139, 141, 142, 143, 147, 148, 149, 150, 151, 154, 155, 158, 159, 160, 161, 162, 163, 164, 165, 169, 172, 175, 177, 179, 180, 182, 184, 185, 187, 195, 196, 197, 198, 200, 0, 6, 13, 15, 18, 23, 26, 33, 37, 39, 46, 48, 56, 60, 62, 64, 66, 73, 76, 79, 81, 85, 87, 90, 96, 103, 105, 111, 116, 122, 126, 129, 133, 136, 140, 146, 153, 157, 168, 171, 174, 176, 178, 181, 183, 186, 194, 201, 5, 12, 22, 32, 36, 45, 55, 59, 72, 75, 84, 95, 102, 110, 121, 128, 135, 145, 152, 156, 167, 170, 173, 193, 202, 4, 11, 21, 31, 35, 44, 54, 71, 101, 109, 120, 144, 166, 192, 199, 203, 3, 20, 43, 53, 100, 108, 191, 204, 2, 42, 99, 190, 205, 41, 98, 189, 206, 188, 207, 208, 209, 210, 211, 212, 213, 214, 215, 216, 217, 218, 219, 220, 221 |
| 200 | 22 | 0x552A55 | 198, 197, 196, 195, 187, 185, 184, 182, 180, 179, 177, 175, 172, 169, 165, 164, 163, 162, 161, 160, 159, 158, 155, 154, 151, 150, 149, 148, 147, 143, 142, 141, 139, 138, 137, 134, 132, 131, 130, 127, 125, 124, 123, 119, 118, 117, 115, 114, 113, 112, 107, 106, 104, 97, 94, 93, 92, 91, 89, 88, 86, 83, 82, 80, 78, 77, 74, 70, 69, 68, 67, 65, 63, 61, 58, 57, 52, 51, 50, 49, 47, 40, 38, 34, 30, 29, 28, 27, 25, 24, 19, 17, 16, 14, 10, 9, 8, 7, 1, 200, 194, 186, 183, 181, 178, 176, 174, 171, 168, 157, 153, 146, 140, 136, 133, 129, 126, 122, 116, 111, 105, 103, 96, 90, 87, 85, 81, 79, 76, 73, 66, 64, 62, 60, 56, 48, 46, 39, 37, 33, 26, 23, 18, 15, 13, 6, 0, 201, 193, 173, 170, 167, 156, 152, 145, 135, 128, 121, 110, 102, 95, 84, 75, 72, 59, 55, 45, 36, 32, 22, 12, 5, 202, 199, 192, 166, 144, 120, 109, 101, 71, 54, 44, 35, 31, 21, 11, 4, 203, 191, 108, 100, |

TABLE 2-continued

| $K_{max}$ | L | CRC polynomial | Interleaving sequence for which reverse-order numbering is used |
|---|---|---|---|
| | | | 53, 43, 20, 3, 204, 190, 99, 42, 2, 205, 189, 98, 41, 206, 188, 207, 208, 209, 210, 211, 212, 213, 214, 215, 216, 217, 218, 219, 220, 221 |
| 200 | 23 | 0x86F4A1 | 4, 6, 11, 12, 17, 18, 19, 20, 21, 23, 24, 30, 31, 33, 35, 37, 40, 42, 45, 46, 47, 50, 51, 54, 55, 57, 58, 59, 60, 62, 64, 65, 66, 75, 76, 78, 80, 83, 84, 86, 87, 88, 90, 93, 95, 97, 98, 100, 105, 106, 109, 110, 111, 112, 113, 114, 115, 116, 119, 122, 124, 125, 126, 127, 128, 129, 130, 132, 134, 135, 138, 139, 140, 142, 144, 146, 148, 149, 150, 152, 153, 154, 157, 160, 162, 166, 167, 168, 169, 171, 174, 175, 176, 179, 181, 185, 186, 187, 188, 194, 195, 196, 198, 200, 3, 5, 10, 16, 22, 29, 32, 34, 36, 39, 41, 44, 49, 53, 56, 61, 63, 74, 77, 79, 82, 85, 89, 92, 94, 96, 99, 104, 108, 118, 121, 123, 131, 133, 137, 141, 143, 145, 147, 151, 156, 159, 161, 165, 170, 173, 178, 180, 184, 193, 197, 199, 201, 2, 9, 15, 28, 38, 43, 48, 52, 73, 81, 91, 103, 107, 117, 120, 136, 155, 158, 164, 172, 177, 183, 192, 202, 1, 8, 14, 27, 72, 102, 163, 182, 191, 203, 0, 7, 13, 26, 71, 101, 190, 204, 25, 70, 189, 205, 69, 206, 68, 207, 67, 208, 209, 210, 211, 212, 213, 214, 215, 216, 217, 218, 219, 220, 221, 222 |
| 200 | 23 | 0x86F4A1 | 198, 196, 195, 194, 188, 187, 186, 185, 181, 179, 176, 175, 174, 171, 169, 168, 167, 166, 162, 160, 157, 154, 153, 152, 150, 149, 148, 146, 144, 142, 140, 139, 138, 135, 134, 132, 130, 129, 128, 127, 126, 125, 124, 122, 119, 116, 115, 114, 113, 112, 111, 110, 109, 106, 105, 100, 98, 97, 95, 93, 90, 88, 87, 86, 84, 83, 80, 78, 76, 75, 66, 65, 64, 62, 60, 59, 58, 57, 55, 54, 51, 50, 47, 46, 45, 42, 40, 37, 35, 33, 31, 30, 24, 23, 21, 20, 19, 18, 17, 12, 11, 6, 4, 200, 199, 197, 193, 184, 180, 178, 173, 170, 165, 161, 159, 156, 151, 147, 145, 143, 141, 137, 133, 131, 123, 121, 118, 108, 104, 99, 96, 94, 92, 89, 85, 82, 79, 77, 74, 63, 61, 56, 53, 49, 44, 41, 39, 36, 34, 32, 29, 22, 16, 10, 5, 3, 201, 192, 183, 177, 172, 164, 158, 155, 136, 120, 117, 107, 103, 91, 81, 73, 52, 48, 43, 38, 28, 15, 9, 2, 202, 191, 182, 163, 102, 72, 27, 14, 8, 1, 203, 190, 101, 71, 26, 13, 7, 0, 204, 189, 70, 25, 205, 69, 206, 68, 207, 67, 208, 209, 210, 211, 212, 213, 214, 215, 216, 217, 218, 219, 220, 221, 222 |
| 200 | 24 | 0x1D11A9B | 0, 1, 5, 7, 10, 12, 13, 16, 17, 19, 20, 21, 24, 26, 28, 29, 31, 33, 35, 38, 41, 44, 46, 48, 50, 51, 52, 56, 57, 58, 62, 63, 67, 68, 69, 70, 72, 73, 74, 77, 78, 80, 81, 83, 85, 86, 88, 89, 90, 94, 97, 105, 108, 111, 113, 114, 115, 119, 120, 125, 130, 132, 135, 137, 139, 140, 142, 144, 145, 149, 150, 152, 153, 155, 157, 158, 159, 160, 161, 162, 164, 166, 167, 171, 175, 177, 179, 180, 183, 186, 187, 188, 191, 193, 194, 196, 197, 199, 200, 4, 6, 9, 11, 15, 18, 23, 25, 27, 30, 32, 34, 37, 40, 43, 45, 47, 49, 55, 61, 66, 71, 76, 79, 82, 84, 87, 93, 96, 104, 107, 110, 112, 118, 124, 129, 131, 134, 136, 138, 141, 143, 148, 151, 154, 156, 163, 165, 170, 174, 176, 178, 182, 185, 190, 192, 195, 198, 201, 3, 8, 14, 22, 36, 39, 42, 54, 60, 65, 75, 92, 95, 103, 106, 109, 117, 123, 128, 133, 147, 169, 173, 181, 184, 189, 202, 2, 53, 59, 64, 91, 102, 116, 122, 127, 146, 168, 172, 203, 101, 121, 126, 204, 100, 205, 99, 206, 98, 207, 208, 209, 210, 211, 212, 213, 214, 215, 216, 217, 218, 219, 220, 221, 222, 223 |
| 200 | 24 | 0x1D11A9B | 199, 197, 196, 194, 193, 191, 188, 187, 186, 183, 180, 179, 177, 175, 171, 167, 166, 164, 162, 161, 160, 159, 158, 157, 155, 153, 152, 150, 149, 145, 144, 142, 140, 139, 137, 135, 132, 130, 125, 120, 119, 115, 114, 113, 111, 108, 105, 97, 94, 90, 89, 88, 86, 85, 83, 81, 80, 78, 77, 74, 73, 72, 70, 69, 68, 67, 63, 62, 58, 57, 56, 52, 51, 50, 48, 46, 44, 41, 38, 35, 33, 31, 29, 28, 26, 24, 21, 20, 19, 17, 16, 13, 12, 10, 7, 5, 1, 0, 200, 198, 195, 192, 190, 185, 182, 178, 176, 174, 170, 165, 163, 156, 154, 151, 148, 143, 141, 138, 136, 134, 131, 129, 124, 118, 112, 110, 107, 104, 96, 93, 87, 84, 82, 79, 76, 71, 66, 61, 55, 49, 47, 45, 43, 40, 37, 34, 32, 30, 27, 25, 23, 18, 15, 11, 9, 6, 4, 201, 189, 184, 181, 173, 169, 147, 133, 128, 123, 117, 109, 106, 103, 95, 92, 75, 65, 60, 54, 42, 39, 36, 22, 14, 8, 3, 202, 172, 168, 146, 127, 122, 116, 102, 91, 64, 59, 53, 2, 203, 126, 121, 101, 204, 100, 205, 99, 206, 98, 207, 208, 209, 210, 211, 212, 213, 214, 215, 216, 217, 218, 219, 220, 221, 222, 223 |
| 1000 | 11 | 0x94F | 0, 3, 4, 5, 7, 8, 9, 10, 12, 14, 15, 16, 18, 19, 20, 21, 22, 23, 24, 25, 27, 31, 32, 33, 37, 38, 40, 41, 42, 43, 44, 48, 50, 52, 53, 55, 57, 59, 60, 61, 62, 64, 66, 70, 74, 78, 79, 80, 82, 85, 86, 87, 88, 91, 94, 96, 99, 101, 102, 104, 106, 107, 108, 110, 113, 114, 120, 121, 122, 123, 125, 126, 127, 128, 129, 131, 137, 139, 140, 142, 143, 147, 150, 151, 155, 158, 160, 164, 165, 166, 167, 169, 170, 173, 176, 177, 179, 180, 182, 183, 188, 190, 192, 193, 196, 197, 202, 203, 205, 208, 211, 212, 215, 216, 217, 221, 222, 223, 225, 226, 229, 231, 233, 237, 238, 240, 241, 242, 247, 249, 250, 251, 254, 255, 256, 257, 258, 261, 263, 265, 267, 268, 269, 270, 271, |

TABLE 2-continued

| $K_{max}$ | L | CRC polynomial | Interleaving sequence for which reverse-order numbering is used |
|---|---|---|---|
| | | | 274, 275, 276, 277, 278, 279, 280, 281, 284, 291, 292, 297, 302, 303, 305, 307, 313, 318, 320, 321, 324, 325, 327, 328, 330, 332, 335, 337, 338, 339, 342, 345, 346, 347, 348, 352, 354, 355, 357, 360, 371, 372, 375, 376, 377, 379, 380, 381, 382, 384, 386, 387, 388, 390, 391, 392, 393, 394, 395, 396, 397, 399, 403, 404, 405, 409, 410, 412, 413, 414, 415, 416, 420, 422, 424, 425, 427, 429, 431, 432, 433, 434, 436, 438, 442, 446, 450, 451, 452, 454, 457, 458, 459, 460, 463, 466, 468, 471, 473, 474, 476, 478, 479, 480, 482, 485, 486, 492, 493, 494, 495, 497, 498, 499, 500, 501, 503, 509, 511, 512, 514, 515, 519, 522, 523, 527, 530, 532, 536, 537, 538, 539, 541, 542, 545, 548, 549, 551, 552, 554, 555, 560, 562, 564, 565, 568, 569, 574, 575, 577, 580, 583, 584, 587, 588, 589, 593, 594, 595, 597, 598, 601, 603, 605, 609, 610, 612, 613, 614, 619, 621, 622, 623, 626, 627, 628, 629, 630, 633, 635, 637, 639, 640, 641, 642, 643, 646, 647, 648, 649, 650, 651, 652, 653, 656, 663, 664, 669, 674, 675, 677, 679, 685, 690, 692, 693, 696, 697, 699, 700, 702, 704, 707, 709, 710, 711, 714, 717, 718, 719, 720, 724, 726, 727, 729, 732, 743, 744, 747, 748, 749, 751, 752, 753, 754, 756, 758, 759, 760, 762, 763, 764, 765, 766, 767, 768, 769, 771, 775, 776, 777, 781, 782, 784, 785, 786, 787, 788, 792, 794, 796, 797, 799, 801, 803, 804, 805, 806, 808, 810, 814, 818, 822, 823, 824, 826, 829, 830, 831, 832, 835, 838, 840, 843, 845, 846, 848, 850, 851, 852, 854, 857, 858, 864, 865, 866, 867, 869, 870, 871, 872, 873, 875, 881, 883, 884, 886, 887, 891, 894, 895, 899, 902, 904, 908, 909, 910, 911, 913, 914, 917, 920, 921, 923, 924, 926, 927, 932, 934, 936, 937, 940, 941, 946, 947, 949, 952, 955, 956, 959, 960, 961, 965, 966, 967, 969, 970, 973, 975, 977, 981, 982, 984, 985, 986, 991, 993, 994, 995, 998, 999, 1000, 2, 6, 11, 13, 17, 26, 30, 36, 39, 47, 49, 51, 54, 56, 58, 63, 65, 69, 73, 77, 81, 84, 90, 93, 95, 98, 100, 103, 105, 109, 112, 119, 124, 130, 136, 138, 141, 146, 149, 154, 157, 159, 163, 168, 172, 175, 178, 181, 187, 189, 191, 195, 201, 204, 207, 210, 214, 220, 224, 228, 230, 232, 236, 239, 246, 248, 253, 260, 262, 264, 266, 273, 283, 290, 296, 301, 304, 306, 312, 317, 319, 323, 326, 329, 331, 334, 336, 341, 344, 351, 353, 356, 359, 370, 374, 378, 383, 385, 389, 398, 402, 408, 411, 419, 421, 423, 426, 428, 430, 435, 437, 441, 445, 449, 453, 456, 462, 465, 467, 470, 472, 475, 477, 481, 484, 491, 496, 502, 508, 510, 513, 518, 521, 526, 529, 531, 535, 540, 544, 547, 550, 553, 559, 561, 563, 567, 573, 576, 579, 582, 586, 592, 596, 600, 602, 604, 608, 611, 618, 620, 625, 632, 634, 636, 638, 645, 655, 662, 668, 673, 676, 678, 684, 689, 691, 695, 698, 701, 703, 706, 708, 713, 716, 723, 725, 728, 731, 742, 746, 750, 755, 757, 761, 770, 774, 780, 783, 791, 793, 795, 798, 800, 802, 807, 809, 813, 817, 821, 825, 828, 834, 837, 839, 842, 844, 847, 849, 853, 856, 863, 868, 874, 880, 882, 885, 890, 893, 898, 901, 903, 907, 912, 916, 919, 922, 925, 931, 933, 935, 939, 945, 948, 951, 954, 958, 964, 968, 972, 974, 976, 980, 983, 990, 992, 997, 1001, 1, 29, 35, 46, 68, 72, 76, 83, 89, 92, 97, 111, 118, 135, 145, 148, 153, 156, 162, 171, 174, 186, 194, 200, 206, 209, 213, 219, 227, 235, 245, 252, 259, 272, 282, 289, 295, 300, 311, 316, 322, 333, 340, 343, 350, 358, 369, 373, 401, 407, 418, 440, 444, 448, 455, 461, 464, 469, 483, 490, 507, 517, 520, 525, 528, 534, 543, 546, 558, 566, 572, 578, 581, 585, 591, 599, 607, 617, 624, 631, 644, 654, 661, 667, 672, 683, 688, 694, 705, 712, 715, 722, 730, 741, 745, 773, 779, 790, 812, 816, 820, 827, 833, 836, 841, 855, 862, 879, 889, 892, 897, 900, 906, 915, 918, 930, 938, 944, 950, 953, 957, 963, 971, 979, 989, 996, 1002, 28, 34, 45, 67, 71, 75, 117, 134, 144, 152, 161, 185, 199, 218, 234, 244, 288, 294, 299, 310, 315, 349, 368, 400, 406, 417, 439, 443, 447, 489, 506, 516, 524, 533, 557, 571, 590, 606, 616, 660, 666, 671, 682, 687, 721, 740, 772, 778, 789, 811, 815, 819, 861, 878, 888, 896, 905, 929, 943, 962, 978, 988, 1003, 116, 133, 184, 198, 243, 287, 293, 298, 309, 314, 367, 488, 505, 556, 570, 615, 659, 665, 670, 681, 686, 739, 860, 877, 928, 942, 987, 1004, 115, 132, 286, 308, 366, 487, 504, 658, 680, 738, 859, 876, 1005, 285, 365, 657, 737, 1006, 364, 736, 1007, 363, 735, 1008, 362, 734, 1009, 361, 733, 1010 |
| 1000 | 11 | 0x94F | 999, 998, 995, 994, 993, 991, 986, 985, 984, 982, 981, 977, 975, 973, 970, 969, 967, 966, 965, 961, 960, 959, 956, 955, 952, 949, 947, 946, 941, 940, 937, 936, 934, 932, 927, 926, 924, 923, 921, 920, 917, 914, 913, 911, 910, 909, 908, 904, 902, 899, 895, 894, 891, 887, 886, 884, 883, 881, 875, 873, 872, 871, 870, 869, 867, 866, 865, 864, 858, 857, 854, 852, 851, 850, 848, 846, 845, 843, 840, 838, 835, 832, 831, 830, 829, 826, 824, 823, 822, 818, 814, 810, 808, 806, 805, 804, 803, 801, 799, 797, 796, 794, 792, 788, 787, 786, 785, 784, 782, 781, 777, 776, 775, 771, 769, 768, 767, 766, 765, 764, 763, 762, 760, 759, 758, 756, 754, 753, 752, 751, 749, 748, 747, 744, 743, 732, 729, 727, 726, 724, 720, 719, 718, |

TABLE 2-continued

| $K_{max}$ | L | CRC polynomial | Interleaving sequence for which reverse-order numbering is used |
|---|---|---|---|
| | | | 717, 714, 711, 710, 709, 707, 704, 702, 700, 699, 697, 696, 693, 692, 690, 685, 679, 677, 675, 674, 669, 664, 663, 656, 653, 652, 651, 650, 649, 648, 647, 646, 643, 642, 641, 640, 639, 637, 635, 633, 630, 629, 628, 627, 626, 623, 622, 621, 619, 614, 613, 612, 610, 609, 605, 603, 601, 598, 597, 595, 594, 593, 589, 588, 587, 584, 583, 580, 577, 575, 574, 569, 568, 565, 564, 562, 560, 555, 554, 552, 551, 549, 548, 545, 542, 541, 539, 538, 537, 536, 532, 530, 527, 523, 522, 519, 515, 514, 512, 511, 509, 503, 501, 500, 499, 498, 497, 495, 494, 493, 492, 486, 485, 482, 480, 479, 478, 476, 474, 473, 471, 468, 466, 463, 460, 459, 458, 457, 454, 452, 451, 450, 446, 442, 438, 436, 434, 433, 432, 431, 429, 427, 425, 424, 422, 420, 416, 415, 414, 413, 412, 410, 409, 405, 404, 403, 399, 397, 396, 395, 394, 393, 392, 391, 390, 388, 387, 386, 384, 382, 381, 380, 379, 377, 376, 375, 372, 371, 360, 357, 355, 354, 352, 348, 347, 346, 345, 342, 339, 338, 337, 335, 332, 330, 328, 327, 325, 324, 321, 320, 318, 313, 307, 305, 303, 302, 297, 292, 291, 284, 281, 280, 279, 278, 277, 276, 275, 274, 271, 270, 269, 268, 267, 265, 263, 261, 258, 257, 256, 255, 254, 251, 250, 249, 247, 242, 241, 240, 238, 237, 233, 231, 229, 226, 225, 223, 222, 221, 217, 216, 215, 212, 211, 208, 205, 203, 202, 197, 196, 193, 192, 190, 188, 183, 182, 180, 179, 177, 176, 173, 170, 169, 167, 166, 165, 164, 160, 158, 155, 151, 150, 147, 143, 142, 140, 139, 137, 131, 129, 128, 127, 126, 125, 123, 122, 121, 120, 114, 113, 110, 108, 107, 106, 104, 102, 101, 99, 96, 94, 91, 88, 87, 86, 85, 82, 80, 79, 78, 74, 70, 66, 64, 62, 61, 60, 59, 57, 55, 53, 52, 50, 48, 44, 43, 42, 41, 40, 38, 37, 33, 32, 31, 27, 25, 24, 23, 22, 21, 20, 19, 18, 16, 15, 14, 12, 10, 9, 8, 7, 5, 4, 3, 0, 1000, 997, 992, 990, 983, 980, 976, 974, 972, 968, 964, 958, 954, 951, 948, 945, 939, 935, 933, 931, 925, 922, 919, 916, 912, 907, 903, 901, 898, 893, 890, 885, 882, 880, 874, 868, 863, 856, 853, 849, 847, 844, 842, 839, 837, 834, 828, 825, 821, 817, 813, 809, 807, 802, 800, 798, 795, 793, 791, 783, 780, 774, 770, 761, 757, 755, 750, 746, 742, 731, 728, 725, 723, 716, 713, 708, 706, 703, 701, 698, 695, 691, 689, 684, 678, 676, 673, 668, 662, 655, 645, 638, 636, 634, 632, 625, 620, 618, 611, 608, 604, 602, 600, 596, 592, 586, 582, 579, 576, 573, 567, 563, 561, 559, 553, 550, 547, 544, 540, 535, 531, 529, 526, 521, 518, 513, 510, 508, 502, 496, 491, 484, 481, 477, 475, 472, 470, 467, 465, 462, 456, 453, 449, 445, 441, 437, 435, 430, 428, 426, 423, 421, 419, 411, 408, 402, 398, 389, 385, 383, 378, 374, 370, 359, 356, 353, 351, 344, 341, 336, 334, 331, 329, 326, 323, 319, 317, 312, 306, 304, 301, 296, 290, 283, 273, 266, 264, 262, 260, 253, 248, 246, 239, 236, 232, 230, 228, 224, 220, 214, 210, 207, 204, 201, 195, 191, 189, 187, 181, 178, 175, 172, 168, 163, 159, 157, 154, 149, 146, 141, 138, 136, 130, 124, 119, 112, 109, 105, 103, 100, 98, 95, 93, 90, 84, 81, 77, 73, 69, 65, 63, 58, 56, 54, 51, 49, 47, 39, 36, 30, 26, 17, 13, 11, 6, 2, 1001, 996, 989, 979, 971, 963, 957, 953, 950, 944, 938, 930, 918, 915, 906, 900, 897, 892, 889, 879, 862, 855, 841, 836, 833, 827, 820, 816, 812, 790, 779, 773, 745, 741, 730, 722, 715, 712, 705, 694, 688, 683, 672, 667, 661, 654, 644, 631, 624, 617, 607, 599, 591, 585, 581, 578, 572, 566, 558, 546, 543, 534, 528, 525, 520, 517, 507, 490, 483, 469, 464, 461, 455, 448, 444, 440, 418, 407, 401, 373, 369, 358, 350, 343, 340, 333, 322, 316, 311, 300, 295, 289, 282, 272, 259, 252, 245, 235, 227, 219, 213, 209, 206, 200, 194, 186, 174, 171, 162, 156, 153, 148, 145, 135, 118, 111, 97, 92, 89, 83, 76, 72, 68, 46, 35, 29, 1, 1002, 988, 978, 962, 943, 929, 905, 896, 888, 878, 861, 819, 815, 811, 789, 778, 772, 740, 721, 687, 682, 671, 666, 660, 616, 606, 590, 571, 557, 533, 524, 516, 506, 489, 447, 443, 439, 417, 406, 400, 368, 349, 315, 310, 299, 294, 288, 244, 234, 218, 199, 185, 161, 152, 144, 134, 117, 75, 71, 67, 45, 34, 28, 1003, 987, 942, 928, 877, 860, 739, 686, 681, 670, 665, 659, 615, 570, 556, 505, 488, 367, 314, 309, 298, 293, 287, 243, 198, 184, 133, 116, 1004, 876, 859, 738, 680, 658, 504, 487, 366, 308, 286, 132, 115, 1005, 737, 657, 365, 285, 1006, 736, 364, 1007, 735, 363, 1008, 734, 362, 1009, 733, 361, 1010 |
| 22 | 3 | 0xD | 20, 17, 16, 15, 13, 10, 9, 8, 21, 2, 19, 18, 6, 3, 1, 14, 12, 22, 11, 0, 5, 7, 23, 4, 24 |
| 22 | 3 | 0xD | 17, 16, 15, 13, 20, 9, 10, 8, 19, 2, 21, 18, 6, 3, 1, 14, 12, 22, 11, 0, 5, 7, 23, 4, 24 |
| 22 | 3 | 0xD | 20, 17, 16, 15, 13, 9, 10, 8, 21, 2, 19, 18, 6, 3, 1, 14, 12, 22, 11, 0, 5, 7, 23, 4, 24 |
| 22 | 3 | 0xD | 20, 17, 16, 15, 9, 10, 8, 13, 21, 2, 19, 18, 6, 3, 1, 14, 12, 22, 11, 0, 5, 7, 23, 4, 24 |

For example, L=19, the polynomial is 0xA2B79, and the interleaving sequence π2={2, 3, 4, 10, 12, 13, 16, 17, 21, 24, 26, 30, 33, 36, 37, 38, 40, 47, 50, 51, 54, 55, 59, 62, 65, 66, 68, 69, 70, 71, 72, 74, 86, 87, 89, 90, 92, 94, 95, 96, 99, 105, 106, 109, 110, 113, 114, 123, 126, 127, 129, 130, 132, 135, 137, 138, 139, 141, 142, 143, 144, 147, 148, 152, 154, 155, 157, 160, 162, 164, 166, 168, 173, 175, 176, 177, 179, 180, 181, 185, 186, 188, 189, 192, 193, 194, 197, 198, 199, 200, 1, 9, 11, 15, 20, 23, 25, 29, 32, 35, 39, 46, 49, 53, 58, 61, 64, 67, 73, 85, 88, 91, 93, 98, 104, 108, 112, 122, 125, 128, 131, 134, 136, 140, 146, 151, 153, 156, 159, 161, 163, 165, 167, 172, 174, 178, 184, 187, 191, 196, 201, 0, 8, 14, 19, 22, 28, 31, 34, 45, 48, 52, 57, 60, 63, 84, 97, 103, 107, 111, 121, 124, 133, 145, 150, 158, 171, 183, 190, 195, 202, 7, 18, 27, 44, 56, 83, 102, 120, 149, 170, 182, 203, 6, 43, 82, 101, 119, 169, 204, 5, 42, 81, 100, 118, 205, 41, 80, 117, 206, 79, 116, 207, 78, 115, 208, 77, 209, 76, 210, 75, 211, 212, 213, 214, 215, 216, 217, 218}. For example, if a length A of a current information bit sequence is equal to 64, a bit sequence obtained after CRC encoding is $\{b_0, b_1, \ldots, b_{82}\}$. A currently required interleaving sequence π2'={2, 3, 4, 10, 12, 13, 16, 17, 21, 24, 26, 30, 33, 36, 37, 38, 40, 47, 50, 51, 54, 55, 59, 62, 64, 1, 9, 11, 15, 20, 23, 25, 29, 32, 35, 39, 46, 49, 53, 58, 61, 65, 0, 8, 14, 19, 22, 28, 31, 34, 45, 48, 52, 57, 60, 63, 66, 7, 18, 27, 44, 56, 67, 6, 43, 68, 5, 42, 69, 41, 70, 71, 72, 73, 74, 75, 76, 77, 78, 79, 80, 81, 82} is extracted from the interleaving sequence π2 based on S302. The sequence $\{b_0, b_1, \ldots, b_{82}\}$ is interleaved based on S303 and S304, to obtain $\{c_0, c_1, \ldots, c_{82}\}$={$b_{61}, b_{60}, b_{59}, b_{53}, b_{51}, b_{50}, b_{47}, b_{46}, b_{42}, b_{39}, b_{37}, b_{33}, b_{30}, b_{27}, b_{26}, b_{25}, b_{23}, b_{16}, b_{13}, b_{12}, b_9, b_8, b_4, b_1, b_{64}, b_{62}, b_{54}, b_{52}, b_{48}, b_{43}, b_{40}, b_{38}, b_{34}, b_{31}, b_{28}, b_{24}, b_{17}, b_{14}, b_{10}, b_5, b_2, b_{65}, b_{63}, b_{55}, b_{49}, b_{44}, b_{41}, b_{35}, b_{32}, b_{29}, b_{18}, b_{15}, b_{11}, b_6, b_3, b_0, b_{66}, b_{56}, b_{45}, b_{36}, b_{19}, b_7, b_{67}, b_{57}, b_{20}, b_{68}, b_{58}, b_{21}, b_{69}, b_{22}, b_{70}, b_{71}, b_{72}, b_{73}, b_{74}, b_{75}, b_{76}, b_{77}, b_{78}, b_{79}, b_{80}, b_{81}, b_{82}$}.

In table 2, when $K_{max}$=200, L=19, and the CRC polynomial is 0xA2B79, there are six corresponding interleaving sequences for which reverse-order numbering is used. A better early termination effect is achieved when a first interleaving sequence, a third interleaving sequence, or a fifth interleaving sequence is used for a high code-rate polar code. A better early termination effect is achieved when a second interleaving sequence, a fourth interleaving sequence, or a sixth interleaving sequence is used for a low code-rate polar code. A better early termination effect is achieved when a first interleaving sequence or a second interleaving sequence is used for polar code SC decoding. A better early termination effect is achieved when a third interleaving sequence or a fourth interleaving sequence is used for a polar code with a long code length. A better early termination effect is achieved when a fifth interleaving sequence or a sixth interleaving sequence is used for a polar code with a short code length. For example, the long code length is a code length greater than 512, and the short code length is a code length less than 512.

When $K_{max}$=200, L=20, and the CRC polynomial is 0x191513, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=200, L=21, and the CRC polynomial is 0x2E2A69, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=200, L=22, and the CRC polynomial is 0x552A55, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=200, L=23, and the CRC polynomial is 0x86F4A1, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=200, L=24, and the CRC polynomial is 0x1D11A9B, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=1000, L=11, and the CRC polynomial is 0x94F, there are two corresponding interleaving sequences for which reverse-order numbering is used. A better early termination effect is achieved when a first interleaving sequence is used for a high code-rate polar code. A better early termination effect is achieved when a second interleaving sequence is used for a low code-rate polar code.

When $K_{max}$=22, L=3, and the CRC polynomial is 0xD, there are four corresponding interleaving sequences for which reverse-order numbering is used. A better early termination effect is achieved when a first interleaving sequence is used for a polar code whose code length is 32 after encoding. A better early termination effect is achieved when a second interleaving sequence is used for a polar code whose code length is 64 after encoding. A better early termination effect is achieved when a third interleaving sequence is used for a polar code whose code length is 128 after encoding. A better early termination effect is achieved when a fourth interleaving sequence is used for a polar code whose code length is 256 after encoding.

Figure 6:
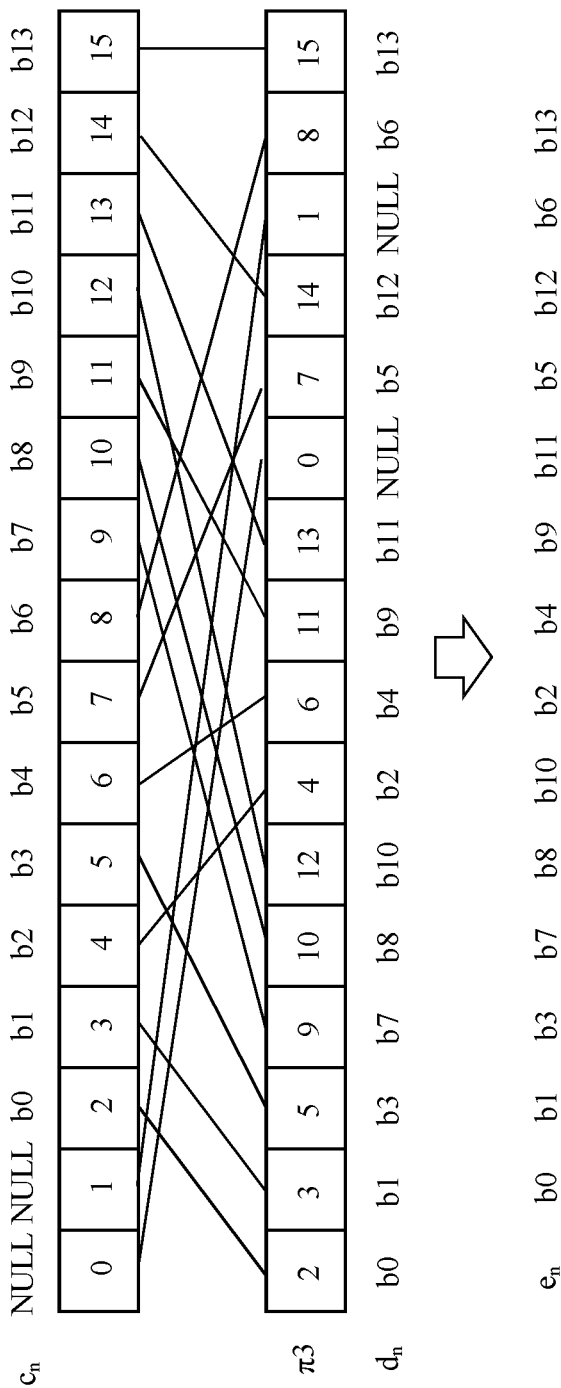
FIG. 6 is a schematic flowchart of an encoding method according to this application.

FIG. 6 is a schematic flowchart of an encoding method according to this application. In this embodiment, for example, an interleaving sequence used for an interleaving operation is a maximum-length interleaving sequence, the maximum-length interleaving sequence used for distributed CRC encoding is a sequence π3 for which natural-order numbering is used, a maximum information bit length corresponding to 73 is $K_{max}$, a CRC polynomial is g, and a CRC bit quantity is L. In other words, a CRC length is L. It is assumed that A to-be-encoded information bits are $\{a_0, a_1, \ldots, a_{A-1}\}$, and the information bit quantity A≤$K_{max}$. This embodiment is performed by a transmit end (an encoder). As shown in FIG. 6, the method in this embodiment includes the following steps.

S401. Perform CRC encoding on A to-be-encoded information bits, to obtain a first bit sequence $\{b_0, b_1, \ldots, b_{A+L-1}\}$.

$\{b_0, b_1, \ldots, b_{A-1}\}$ are A information bits, and $\{b_A, b_{A+1}, \ldots, b_{A+L-1}\}$ are L CRC bits.

S402. Extend the first bit sequence $\{b, b_1, \ldots, b_{A+L-1}\}$ to a fourth bit sequence $\{c_0, c_1, \ldots, c_{Kmax+L-1}\}$ including $K_{max}+L$ bits, where values of first $K_{max}-A$ bits in the fourth bit sequence are set to NULL, and remaining bits sequentially correspond to the bits in the first bit sequence from a $(K_{max}-A+1)^{th}$ bit.

Specifically, the first bit sequence $\{b_0, b_1, \ldots, b_{A+L-1}\}$ is extended, to obtain the fourth bit sequence $\{c_0, c_1, \ldots, c_{Kmax+L-1}\}$. When $k=0, 1, \ldots, K_{max}-A-1$, $c_k$=NULL. When $k=K_{max}-A, K_{max}-A+1, \ldots, K_{max}+L-1$, $c_k=b_{(k-(Kmax-A))}$.

For example, as shown in FIG. 6, the first bit sequence shown in FIG. 6 is $\{b_0, b_1, \ldots, b_{13}\}$, and the obtained fourth bit sequence is $\{NULL, NULL, b_0, b_1, \ldots, b_{13}\}$.

S403. Perform an interleaving operation on the fourth bit sequence $\{c_0, c_1, \ldots, c_{Kmax+L-1}\}$ by using a maximum-length interleaving sequence $\pi 3$, to obtain a fifth bit sequence $\{d_0, d_1, \ldots, d_{Kmax+L-1}\}$.

For example, as shown in FIG. 6, $\pi 3$ is $\{2, 3, 5, 9, 10, 12, 4, 6, 11, 13, 0, 7, 14, 1, 8, 15\}$. The interleaving operation is performed on the fourth bit sequence $\{NULL, NULL, b_0, b_1, \ldots, b_{13}\}$ shown in FIG. 6 by using $\pi 3$, to obtain the fifth bit sequence $\{b_0, b_1, b_3, b_7, b_8, b_{10}, b_2, b_4, b_9, b_{11}, NULL, b_5, b_{12}, NULL, b_6, b_{13}\}$.

S404. Obtain the second bit sequence $\{e_0, e_1, \ldots, e_{A+L-1}\}$ by removing the bits whose values are NULL from the fifth bit sequence $\{d_0, d_1, \ldots, d_{Kmax+L-1}\}$.

For example, as shown in FIG. 6, the bits whose values are NULL are removed from the fifth bit sequence $\{b_0, b_1, b_3, b_7, b_8, b_{10}, b_2, b_4, b_9, b_{11}, NULL, b_5, b_{12}, NULL, b_6, b_{13}\}$, to obtain the second bit sequence $e_n$ $\{b_0, b_1, b_3, b_7, b_8, b_{10}, b_2, b_4, b_9, b_{11}, b_5, b_{12}, b_6, b_{13}\}$.

S405. Perform polar encoding on the second bit sequence.

In this embodiment, as shown in the foregoing Table 1, for an interleaving sequence in Table 1, different CRC polynomials and corresponding interleaving sequences for which natural-order numbering is used are provided for different CRC lengths L and different maximum information bit quantities $K_{max}$. For details, refer to Table 1. Different interleaving sequences are applicable to a different scenario. For details, refer to the descriptions of the sequences in Table 1. The details are not described herein again.

For example, L=19, the polynomial is 0xA2B79, and the interleaving sequence $\pi 3$={0, 1, 2, 5, 6, 7, 10, 11, 13, 14, 14, 19, 20, 22, 23, 24, 26, 31, 33, 35, 37, 39, 42, 44, 45, 47, 51, 52, 55, 56, 57, 58, 60, 61, 62, 64, 67, 69, 70, 72, 73, 76, 85, 86, 89, 90, 93, 94, 100, 103, 104, 105, 107, 109, 110, 112, 113, 125, 127, 128, 129, 130, 131, 133, 134, 137, 140, 144, 145, 148, 149, 152, 159, 161, 162, 163, 166, 169, 173, 175, 178, 182, 183, 186, 187, 189, 195, 196, 197, 200, 3, 8, 12, 15, 21, 25, 27, 32, 34, 36, 38, 40, 43, 46, 48, 53, 59, 63, 65, 68, 71, 74, 77, 87, 91, 95, 101, 106, 108, 111, 114, 126, 132, 135, 138, 141, 146, 150, 153, 160, 164, 167, 170, 174, 176, 179, 184, 188, 190, 198, 201, 4, 9, 16, 28, 41, 49, 54, 66, 75, 78, 88, 92, 96, 102, 115, 136, 139, 142, 147, 151, 154, 165, 168, 171, 177, 180, 185, 191, 199, 202, 17, 29, 50, 79, 97, 116, 143, 155, 172, 181, 192, 203, 30, 80, 98, 117, 156, 193, 204, 81, 99, 118, 157, 194, 205, 82, 119, 158, 206, 83, 120, 207, 84, 121, 208, 122, 209, 123, 210, 124, 211, 212, 213, 214, 215, 216, 217, 218}. For example, if a length A of a current information bit sequence is equal to 64, a bit sequence obtained after CRC encoding is $\{b_0, b_1, \ldots, b_{82}\}$. The sequence $\{c_0, c_1, \ldots, c_{Kmax+L-1}\}$={NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, $b_{31}$, $b_{32}$, $b_{33}$, $b_{34}$, $b_{35}$, $b_{36}$, $b_{37}$, $b_{38}$, $b_{39}$, $b_{40}$, $b_{41}$, $b_{42}$, $b_{43}$, $b_{44}$, $b_{45}$, $b_{46}$, $b_{47}$, $b_{48}$, $b_{49}$, $b_{50}$, $b_{51}$, $b_{52}$, $b_{53}$, $b_{54}$, $b_{55}$, $b_{56}$, $b_{57}$, $b_{58}$, $b_{59}$, $b_{60}$, $b_{61}$, $b_{62}$, $b_{63}$, $b_{64}$, $b_{65}$, $b_{66}$, $b_{67}$, $b_{68}$, $b_{69}$, $b_{70}$, $b_{71}$, $b_{72}$, $b_{73}$, $b_{74}$, $b_{75}$, $b_{76}$, $b_{77}$, $b_{78}$, $b_{79}$, $b_{80}$, $b_{81}$, $b_{82}\}$ is first obtained based on S402. The $\{c_0, c_1, \ldots, c_{Kmax+L-1}\}$ is interleaved based on S403 and the interleaving sequence $\pi 3$, to obtain $\{d_0, d_1, \ldots, d_{Kmax+L-1}\}$={NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, $b_1$, $b_4$, $b_8$, $b_9$, $b_{12}$, $b_{13}$, $b_{16}$, $b_{23}$, $b_{25}$, $b_{26}$, $b_{27}$, $b_{30}$, $b_{33}$, $b_{37}$, $b_{39}$, $b_{42}$, $b_{46}$, $b_{47}$, $b_{50}$, $b_{51}$, $b_{53}$, $b_{59}$, $b_{60}$, $b_{61}$, $b_{64}$, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, NULL, $b_2$, $b_5$, $b_{10}$, $b_{14}$, $b_{17}$, $b_{24}$, $b_{28}$, $b_{31}$, $b_{34}$, $b_{38}$, $b_{40}$, $b_{43}$, $b_{48}$, $b_{52}$, $b_{54}$, $b_{62}$, $b_{65}$, NULL, NULL, NULL, NULL, NULL, NULL, NULL, NULL, NULL, NULL, NULL, NULL, NULL, NULL, $b_0$, $b_3$, $b_6$, $b_{11}$, $b_{15}$, $b_{18}$, $b_{29}$, $b_{32}$, $b_{35}$, $b_{41}$, $b_{44}$, $b_{49}$, $b_{55}$, $b_{63}$, $b_{66}$, NULL, NULL, NULL, NULL, NULL, NULL, $b_7$, $b_{19}$, $b_{36}$, $b_{45}$, $b_{56}$, $b_{67}$, NULL, NULL, NULL, NULL, $b_{200}$, $b_{57}$, $b_{68}$, NULL, NULL, NULL, $b_{21}$, $b_{58}$, $b_{69}$, NULL, NULL, $b_{22}$, $b_{70}$, NULL, NULL, $b_{71}$, NULL, NULL, $b_{72}$, NULL, $b_{73}$, NULL, $b_{74}$, NULL, $b_{75}$, $b_{76}$, $b_{77}$, $b_{78}$, $b_{79}$, $b_{80}$, $b_{81}$, $b_{82}\}$. NULL bits are removed from $\{d_0, d_1, \ldots, d_{Kmax+L-1}\}$ based on S404, to obtain the sequence $\{e_0, e_1, \ldots, e_{A+L-1}\}$={$b_1$, $b_4$, $b_8$, $b_9$, $b_{12}$, $b_{13}$, $b_{16}$, $b_{23}$, $b_{25}$, $b_{26}$, $b_{27}$, $b_{30}$, $b_{33}$, $b_{37}$, $b_{39}$, $b_{42}$, $b_{46}$, $b_{47}$, $b_{50}$, $b_{51}$, $b_{53}$, $b_{59}$, $b_{60}$, $b_{61}$, $b_{64}$, $b_2$, $b_5$, $b_{10}$, $b_{14}$, $b_{17}$, $b_{24}$, $b_{28}$, $b_{31}$, $b_{34}$, $b_{38}$, $b_{40}$, $b_{43}$, $b_{48}$, $b_{52}$, $b_{54}$, $b_{62}$, $b_{65}$, $b_0$, $b_3$, $b_6$, $b_{11}$, $b_{15}$, $b_{18}$, $b_{29}$, $b_{32}$, $b_{35}$, $b_{41}$, $b_{44}$, $b_{49}$, $b_{55}$, $b_{63}$, $b_{66}$, $b_7$, $b_{19}$, $b_{36}$, $b_{45}$, $b_{56}$, $b_{67}$, $b_{20}$, $b_{57}$, $b_{68}$, $b_{21}$, $b_{58}$, $b_{69}$, $b_{22}$, $b_{70}$, $b_{71}$, $b_{72}$, $b_{73}$, $b_{74}$, $b_{75}$, $b_{76}$, $b_{77}$, $b_{78}$, $b_{79}$, $b_{80}$, $b_{81}$, $b_{82}\}$.

It should be noted that a receive end (a decoder side) needs to perform a de-interleaving operation after receiving to-be-decoded information bits. A process in which the receive end (decoder) obtains an interleaving sequence during de-interleaving is consistent with a process in which the transmit end (an encoder side) obtains an interleaving sequence during interleaving. For details, refer to the descriptions of the encoder. The details are not described herein.

In this application, the transmit end may be divided into function modules based on the foregoing method examples.

For example, each function module may be obtained through division for a corresponding function, or two or more functions may be integrated into one processing module. The integrated module may be implemented in a form of hardware, or may be implemented in a form of a software function module. It should be noted that module division in the embodiments of this application is merely an example, is merely logical function division, and may be other division during actual implementation.

Figure 7:
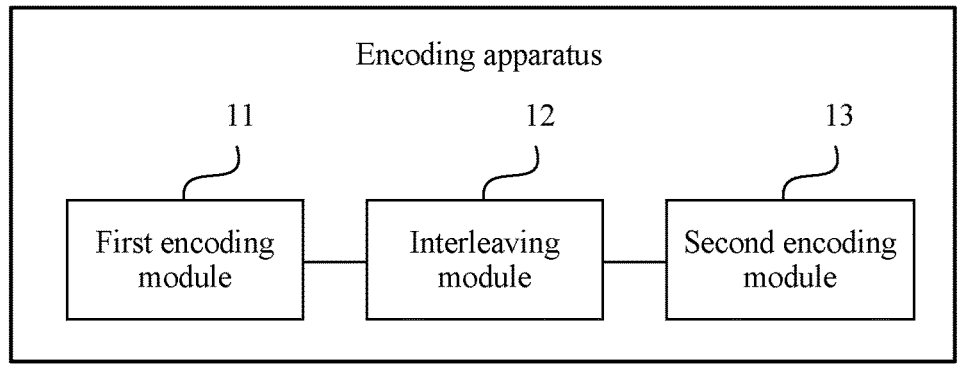
FIG. 7 is a schematic structural diagram of an embodiment of an encoding apparatus according to this application.

FIG. 7 is a schematic structural diagram of an embodiment of an encoding apparatus according to this application. As shown in FIG. 7, the apparatus in this embodiment may include a first encoding module 11, an interleaving module 12, and a second encoding module 13. The first encoding module 11 is configured to perform cyclic redundancy check CRC encoding on A to-be-encoded information bits, to obtain a first bit sequence. The first bit sequence includes L CRC bits and A information bits, and L and A are positive integers. The interleaving module 12 is configured to perform an interleaving operation on the first bit sequence, to obtain a second bit sequence. A first interleaving sequence used for the interleaving operation is obtained based on a system-supported maximum-length interleaving sequence and a preset rule, and a length of the first interleaving sequence is equal to A+L. Alternatively, a second interleaving sequence used for the interleaving operation is the maximum-length interleaving sequence, a length of the second interleaving sequence is equal to $K_{max}+L$, and $K_{max}$ is a maximum information bit quantity corresponding to the maximum-length interleaving sequence. The second encoding module 13 is configured to perform polar encoding on the second bit sequence.

Optionally, the preset rule is: the first interleaving sequence is sequentially constituted by extracting all indexes greater than or equal to $K_{max}-A$ from the maximum-length interleaving sequence and subtracting $K_{max}-A$ from each of all the extracted indexes. The interleaving module 12 is configured to perform the interleaving operation on the first bit sequence by using the first interleaving sequence, to obtain the second bit sequence. The maximum-length interleaving sequence is any sequence in the foregoing Table 1.

Optionally, the preset rule is: the first interleaving sequence is constituted by sequentially extracting all indexes less than A or greater than or equal to $K_{max}$ from the maximum-length interleaving sequence and subtracting $K_{max}-A$ from indexes greater than or equal to $K_{max}$ in the extracted indexes. The interleaving module 12 is configured to: arrange the A information bits in the first bit sequence in descending order of information bit indexes, to obtain a third bit sequence; and perform the interleaving operation on the third bit sequence by using the first interleaving sequence, to obtain the second bit sequence. The maximum-length interleaving sequence is any sequence in the foregoing Table 2.

Optionally, when the second interleaving sequence used for the interleaving operation is the maximum-length interleaving sequence, the interleaving module 12 is configured to: extend the first bit sequence to a fourth bit sequence including $K_{max}+L$ bits, where values of first $K_{max}-A$ bits in the fourth bit sequence are set to NULL, and remaining bits sequentially correspond to the bits in the first bit sequence from a $(K_{max}-A+1)^{th}$ bit; perform the interleaving operation on the fourth bit sequence by using the maximum-length interleaving sequence, to obtain a fifth bit sequence; and obtain the second bit sequence by removing the bits whose values are NULL from the fifth bit sequence. The maximum-length interleaving sequence is any sequence in the foregoing Table 1.

The apparatus in this embodiment may be configured to perform the technical solutions in the method embodiment shown in FIG. 3. An implementation principle and technical effects of the apparatus are similar to those of the method embodiment. Details are not described herein again.

Figure 8:
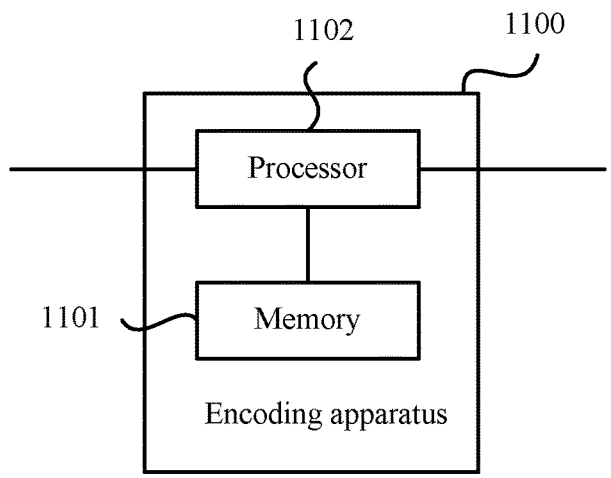
FIG. 8 is a schematic diagram of an encoding entity apparatus according to this application.

FIG. 8 is a schematic diagram of an encoding entity apparatus according to this application. The apparatus 1100 includes a memory 1101 and a processor 1102.

The memory 1101 is configured to store a program instruction. The memory may be a flash memory (flash memory).

The processor 1102 is configured to: invoke and execute the program instruction in the memory, to perform the steps in the encoding method shown in FIG. 3. For details, refer to the related descriptions in the foregoing method embodiment.

Figure 9:
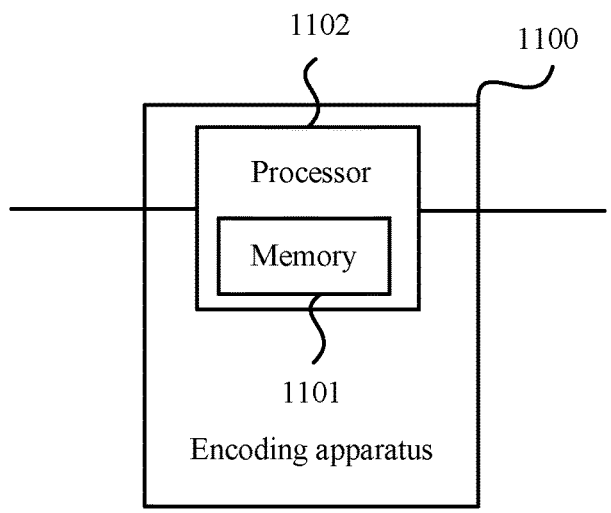
FIG. 9 is a schematic diagram of an encoding entity apparatus according to this application.

Optionally, the memory 1101 may be independent, or may be arranged as shown in FIG. 9. FIG. 9 is a schematic diagram of an encoding entity apparatus according to this application. The memory 1101 is integrated into the processor 1102.

The apparatus may be configured to perform the steps and/or procedures that correspond to the transmit end in the foregoing method embodiment.

This application further provides a computer system, including a readable storage medium and a computer program. The computer program is configured to perform the encoding method provided in the foregoing implementations.

This application further provides a program product. The program product includes a computer program, and the computer program is stored in a readable storage medium. At least one processor of an encoding apparatus may read the computer program from the readable storage medium, and the at least one processor executes the computer program, so that the encoding apparatus performs the encoding method provided in the foregoing implementations.

A person of ordinary skill in the art may understand that all or some of the foregoing embodiments may be implemented by using software, hardware, firmware, or any combination thereof. When the embodiments are implemented by using software, all or some of the embodiments may be implemented in a form of a computer program product. The computer program product includes one or more computer instructions. When the computer program instructions are loaded and executed on a computer, all or some of the procedures or functions according to the embodiments of the present invention are generated. The computer may be a general-purpose computer, a dedicated computer, a computer network, or another programmable apparatus. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer readable storage medium may be any usable medium accessible to a computer, or may be a data storage device, such as a server or a data center, integrating one or more usable media. The usable medium may be a magnetic medium (for example, a floppy disk, a hard disk, or a magnetic tape), an optical medium (for example, DVD), a semiconductor medium (for example, a solid state disk (SSD)), or the like.

What is claimed is:

1. A data transmission method by a transmit end, comprising:

obtaining, by the transmit end, A to-be-encoded information bits;

performing, by the transmit end, cyclic redundancy check (CRC) encoding on the A to-be-encoded information bits, to obtain a first bit sequence, wherein the first bit sequence comprises L CRC bits and the A to-be-encoded information bits, and L and A are positive integers;

performing, by the transmit end, an interleaving operation on the first bit sequence, to obtain a second bit sequence, wherein a first interleaving sequence used for the interleaving operation comprises extracting all indexes greater than or equal to $K_{max}$-A from a maximum-length interleaving sequence and subtracting $K_{max}$-A from each of all the extracted indexes, a length of the first interleaving sequence is equal to A+L, a length of the maximum-length interleaving sequence is equal to $K_{max}$+L, and $K_{max}$ is a maximum information bit quantity corresponding to the maximum-length interleaving sequence and performing, by the transmit end, polar encoding on the second bit sequence to obtain encoded information; and outputting, by the transmit end, the encoded information.

2. The method according to claim 1, wherein the maximum-length interleaving sequence, with Kmax=200, L=24, a CRC polynomial of 0x1D11A9B, is:

0, 2, 3, 5, 6, 8, 11, 12, 13, 16, 19, 20, 22, 24, 28, 32, 33, 35, 37, 38, 39, 40, 41, 42, 44, 46, 47, 49, 50, 54, 55, 57, 59, 60, 62, 64, 67, 69, 74, 79, 80, 84, 85, 86, 88, 91, 94, 102, 105, 109, 110, 111, 113, 114, 116, 118, 119, 121, 122, 125, 126, 127, 129, 130, 131, 132, 136, 137, 141, 142, 143, 147, 148, 149, 151, 153, 155, 158, 161, 164, 166, 168, 170, 171, 173, 175, 178, 179, 180, 182, 183, 186, 187, 189, 192, 194, 198, 199, 200, 1, 4, 7, 9, 14, 17, 21, 23, 25, 29, 34, 36, 43, 45, 48, 51, 56, 58, 61, 63, 65, 68, 70, 75, 81, 87, 89, 92, 95, 103, 106, 112, 115, 117, 120, 123, 128, 133, 138, 144, 150, 152, 154, 156, 159, 162, 165, 167, 169, 172, 174, 176, 181, 184, 188, 190, 193, 195, 201, 10, 15, 18, 26, 30, 52, 66, 71, 76, 82, 90, 93, 96, 104, 107, 124, 134, 139, 145, 157, 160, 163, 177, 185, 191, 196, 202, 27, 31, 53, 72, 77, 83, 97, 108, 135, 140, 146, 197, 203, 73, 78, 98, 204, 99, 205, 100, 206, 101, 207, 208, 209, 210, 211, 212, 213, 214, 215, 216, 217, 218, 219, 220, 221, 222, 223; or 199, 198, 194, 192, 189, 187, 186, 183, 182, 180, 179, 178, 175, 173, 171, 170, 168, 166, 164, 161, 158, 155, 153, 151, 149, 148, 147, 143, 142, 141, 137, 136, 132, 131, 130, 129, 127, 126, 125, 122, 121, 119, 118, 116, 114, 113, 111, 110, 109, 105, 102, 94, 91, 88, 86, 85, 84, 80, 79, 74, 69, 67, 64, 62, 60, 59, 57, 55, 54, 50, 49, 47, 46, 44, 42, 41, 40, 39, 38, 37, 35, 33, 32, 28, 24, 22, 20, 19, 16, 13, 12, 11, 8, 6, 5, 3, 2, 0, 200, 195, 193, 190, 188, 184, 181, 176, 174, 172, 169, 167, 165, 162, 159, 156, 154, 152, 150, 144, 138, 133, 128, 123, 120, 117, 115, 112, 106, 103, 95, 92, 89, 87, 81, 75, 70, 68, 65, 63, 61, 58, 56, 51, 48, 45, 43, 36, 34, 29, 25, 23, 21, 17, 14, 9, 7, 4, 1, 201, 196, 191, 185, 177, 163, 160, 157, 145, 139, 134, 124, 107, 104, 96, 93, 90, 82, 76, 71, 66, 52, 30, 26, 18, 15, 10, 202, 197, 146, 140, 135, 108, 97, 83, 77, 72, 53, 31, 27, 203, 98, 78, 73, 204, 99, 205, 100, 206, 101, 207, 208, 209, 210, 211, 212, 213, 214, 215, 216, 217, 218, 219, 220, 221, 222, 223.

3. A data transmission apparatus, comprising:

a non-transitory memory configured to store a program instruction; and a processor configured to access the program instruction, wherein the processor executes the program instruction:

obtain A to-be-encoded information bits, perform cyclic redundancy check (CRC) encoding on the A to-be-encoded information bits, to obtain a first bit sequence, wherein the first bit sequence comprises L CRC bits and A information bits, and L and A are positive integers, perform an interleaving operation on the first bit sequence, to obtain a second bit sequence wherein a first interleaving sequence used for the interleaving operation comprises extracting all indexes greater than or equal to $K_{max}$-A from a maximum-length interleaving sequence and subtracting $K_{max}$-A from each of all the extracted indexes, a length of the first interleaving sequence is equal to A+L, a length of the maximum-length interleaving sequence is equal to $K_{max}$+L, and $K_{max}$ is a maximum information bit quantity corresponding to the maximum-length interleaving sequence, perform polar encoding on the second bit sequence to obtain encoded information, and output the encoded information.

4. The apparatus according to claim 3, wherein the maximum-length interleaving sequence, with $K_{max}$=200, L=24, a CRC polynomial of 0x1D11A9B, is:

0, 2, 3, 5, 6, 8, 11, 12, 13, 16, 19, 20, 22, 24, 28, 32, 33, 35, 37, 38, 39, 40, 41, 42, 44, 46, 47, 49, 50, 54, 55, 57, 59, 60, 62, 64, 67, 69, 74, 79, 80, 84, 85, 86, 88, 91, 94, 102, 105, 109, 110, 111, 113, 114, 116, 118, 119, 121, 122, 125, 126, 127, 129, 130, 131, 132, 136, 137, 141, 142, 143, 147, 148, 149, 151, 153, 155, 158, 161, 164, 166, 168, 170, 171, 173, 175, 178, 179, 180, 182, 183, 186, 187, 189, 192, 194, 198, 199, 200, 1, 4, 7, 9, 14, 17, 21, 23, 25, 29, 34, 36, 43, 45, 48, 51, 56, 58, 61, 63, 65, 68, 70, 75, 81, 87, 89, 92, 95, 103, 106, 112, 115, 117, 120, 123, 128, 133, 138, 144, 150, 152, 154, 156, 159, 162, 165, 167, 169, 172, 174, 176, 181, 184, 188, 190, 193, 195, 201, 10, 15, 18, 26, 30, 52, 66, 71, 76, 82, 90, 93, 96, 104, 107, 124, 134, 139, 145, 157, 160, 163, 177, 185, 191, 196, 202, 27, 31, 53, 72, 77, 83, 97, 108, 135, 140, 146, 197, 203, 73, 78, 98, 204, 99, 205, 100, 206, 101, 207, 208, 209, 210, 211, 212, 213, 214, 215, 216, 217, 218, 219, 220, 221, 222, 223; or 199, 198, 194, 192, 189, 187, 186, 183, 182, 180, 179, 178, 175, 173, 171, 170, 168, 166, 164, 161, 158, 155, 153, 151, 149, 148, 147, 143, 142, 141, 137, 136, 132, 131, 130, 129, 127, 126, 125, 122, 121, 119, 118, 116, 114, 113, 111, 110, 109, 105, 102, 94, 91, 88, 86, 85, 84, 80, 79, 74, 69, 67, 64, 62, 60, 59, 57, 55, 54, 50, 49, 47, 46, 44, 42, 41, 40, 39, 38, 37, 35, 33, 32, 28, 24, 22, 20, 19, 16, 13, 12, 11, 8, 6, 5, 3, 2, 0, 200, 195, 193, 190, 188, 184, 181, 176, 174, 172, 169, 167, 165, 162, 159, 156, 154, 152, 150, 144, 138, 133, 128, 123, 120, 117, 115, 112, 106, 103, 95, 92, 89, 87, 81, 75, 70, 68, 65, 63, 61, 58, 56, 51, 48, 45, 43, 36, 34, 29, 25, 23, 21, 17, 14, 9, 7, 4, 1, 201, 196, 191, 185, 177, 163, 160, 157, 145, 139, 134, 124, 107, 104, 96, 93, 90, 82, 76, 71, 66, 52, 30, 26, 18, 15, 10, 202, 197, 146, 140, 135, 108, 97, 83, 77, 72, 53, 31, 27, 203, 98, 78, 73, 204, 99, 205, 100, 206, 101, 207, 208, 209, 210, 211, 212, 213, 214, 215, 216, 217, 218, 219, 220, 221, 222, 223.

5. A data transmission method by a transmit end, comprising:
  obtaining, by the transmit end, A to-be-encoded information bits;
  performing, by the transmit end, a cyclic redundancy check (CRC) encoding on the A to-be-encoded information bits, to obtain a first bit sequence, wherein the first bit sequence comprises L CRC bits and the A to-be-encoded information bits, and L and A are positive integers;
  obtaining, by the transmit end, a third bit sequence by arranging the A information bits in the first bit sequence in descending order of information bit indexes;
  performing, by the transmit end, an interleaving operation on the third bit sequence to obtain a second bit sequence, wherein a first interleaving sequence used for the interleaving operation comprises extracting all indexes less than A or greater than or equal to $K_{max}$ from a maximum-length interleaving sequence and subtracting $K_{max}$–A from indexes greater than or equal to $K_{max}$ in the extracted indexes, a length of the first interleaving sequence is equal to A+L, a length of the maximum-length interleaving sequence is equal to $K_{max}$+L, and $K_{max}$ is a maximum information bit quantity corresponding to the maximum-length interleaving sequence;
  performing, by the transmit end, polar encoding on the second bit sequence to obtain encoded information; and
  outputting, by the transmit end, the encoded information.

6. The method according to claim 5, wherein the maximum-length interleaving sequence, with $K_{max}$=200, L=24, a CRC polynomial of 0x1D11A9B, for which reverse-order numbering is used, is:
  0, 1, 5, 7, 10, 12, 13, 16, 17, 19, 20, 21, 24, 26, 28, 29, 31, 33, 35, 38, 41, 44, 46, 48, 50, 51, 52, 56, 57, 58, 62, 63, 67, 68, 69, 70, 72, 73, 74, 77, 78, 80, 81, 83, 85, 86, 88, 89, 90, 94, 97, 105, 108, 111, 113, 114, 115, 119, 120, 125, 130, 132, 135, 137, 139, 140, 142, 144, 145, 149, 150, 152, 153, 155, 157, 158, 159, 160, 161, 162, 164, 166, 167, 171, 175, 177, 179, 180, 183, 186, 187, 188, 191, 193, 194, 196, 197, 199, 200, 4, 6, 9, 11, 15, 18, 23, 25, 27, 30, 32, 34, 37, 40, 43, 45, 47, 49, 55, 61, 66, 71, 76, 79, 82, 84, 87, 93, 96, 104, 107, 110, 112, 118, 124, 129, 131, 134, 136, 138, 141, 143, 148, 151, 154, 156, 163, 165, 170, 174, 176, 178, 182, 185, 190, 192, 195, 198, 201, 3, 8, 14, 22, 36, 39, 42, 54, 60, 65, 75, 92, 95, 103, 106, 109, 117, 123, 128, 133, 147, 169, 173, 181, 184, 189, 202, 2, 53, 59, 64, 91, 102, 116, 122, 127, 146, 168, 172, 203, 101, 121, 126, 204, 100, 205, 99, 206, 98, 207, 208, 209, 210, 211, 212, 213, 214, 215, 216, 217, 218, 219, 220, 221, 222, 223; or
  199, 197, 196, 194, 193, 191, 188, 187, 186, 183, 180, 179, 177, 175, 171, 167, 166, 164, 162, 161, 160, 159, 158, 157, 155, 153, 152, 150, 149, 145, 144, 142, 140, 139, 137, 135, 132, 130, 125, 120, 119, 115, 114, 113, 111, 108, 105, 97, 94, 90, 89, 88, 86, 85, 83, 81, 80, 78, 77, 74, 73, 72, 70, 69, 68, 67, 63, 62, 58, 57, 56, 52, 51, 50, 48, 46, 44, 41, 38, 35, 33, 31, 29, 28, 26, 24, 21, 20, 19, 17, 16, 13, 12, 10, 7, 5, 1, 0, 200, 198, 195, 192, 190, 185, 182, 178, 176, 174, 170, 165, 163, 156, 154, 151, 148, 143, 141, 138, 136, 134, 131, 129, 124, 118, 112, 110, 107, 104, 96, 93, 87, 84, 82, 79, 76, 71, 66, 61, 55, 49, 47, 45, 43, 40, 37, 34, 32, 30, 27, 25, 23, 18, 15, 11, 9, 6, 4, 201, 189, 184, 181, 173, 169, 147, 133, 128, 123, 117, 109, 106, 103, 95, 92, 75, 65, 60, 54, 42, 39, 36, 22, 14, 8, 3, 202, 172, 168, 146, 127, 122, 116, 102, 91, 64, 59, 53, 2, 203, 126, 121, 101, 204, 100, 205, 99, 206, 98, 207, 208, 209, 210, 211, 212, 213, 214, 215, 216, 217, 218, 219, 220, 221, 222, 223.

7. A data transmission apparatus, comprising:
  a non-transitory memory configured to store a program instruction; and
  a processor configured to access the program instruction, wherein the processor executes the program instruction:
  obtain A to-be-encoded information bits,
  perform cyclic redundancy check (CRC) encoding on the A to-be-encoded information bits, to obtain a first bit sequence, wherein the first bit sequence comprises L CRC bits and A information bits, and L and A are positive integers,
  arrange the A information bits in the first bit sequence in descending order of information bit indexes, to obtain a third bit sequence,
  perform an interleaving operation on the third bit sequence to obtain the second bit sequence, wherein a first interleaving sequence used for the interleaving operation comprises extracting all indexes less than A or greater than or equal to $K_{max}$ from a maximum-length interleaving sequence and subtracting $K_{max}$–A from indexes greater than or equal to $K_{max}$ in the extracted indexes, a length of the first interleaving sequence is equal to A+L, a length of the maximum-length interleaving sequence is equal to $K_{max}$+L, and $K_{max}$ is a maximum information bit quantity corresponding to the maximum-length interleaving sequence;
  perform polar encoding on the second bit sequence to obtain encoded information; and
  output the encoded information.

8. The apparatus according to claim 7, wherein the maximum-length interleaving sequence, with $K_{max}$=200, L=24, a CRC polynomial of 0x1D11A9B, for which reverse-order numbering is used, is:
  0, 1, 5, 7, 10, 12, 13, 16, 17, 19, 20, 21, 24, 26, 28, 29, 31, 33, 35, 38, 41, 44, 46, 48, 50, 51, 52, 56, 57, 58, 62, 63, 67, 68, 69, 70, 72, 73, 74, 77, 78, 80, 81, 83, 85, 86, 88, 89, 90, 94, 97, 105, 108, 111, 113, 114, 115, 119, 120, 125, 130, 132, 135, 137, 139, 140, 142, 144, 145, 149, 150, 152, 153, 155, 157, 158, 159, 160, 161, 162, 164, 166, 167, 171, 175, 177, 179, 180, 183, 186, 187, 188, 191, 193, 194, 196, 197, 199, 200, 4, 6, 9, 11, 15, 18, 23, 25, 27, 30, 32, 34, 37, 40, 43, 45, 47, 49, 55, 61, 66, 71, 76, 79, 82, 84, 87, 93, 96, 104, 107, 110, 112, 118, 124, 129, 131, 134, 136, 138, 141, 143, 148, 151, 154, 156, 163, 165, 170, 174, 176, 178, 182, 185, 190, 192, 195, 198, 201, 3, 8, 14, 22, 36, 39, 42, 54, 60, 65, 75, 92, 95, 103, 106, 109, 117, 123, 128, 133, 147, 169, 173, 181, 184, 189, 202, 2, 53, 59, 64, 91, 102, 116, 122, 127, 146, 168, 172, 203, 101, 121, 126, 204, 100, 205, 99, 206, 98, 207, 208, 209, 210, 211, 212, 213, 214, 215, 216, 217, 218, 219, 220, 221, 222, 223; or
  199, 197, 196, 194, 193, 191, 188, 187, 186, 183, 180, 179, 177, 175, 171, 167, 166, 164, 162, 161, 160, 159, 158, 157, 155, 153, 152, 150, 149, 145, 144, 142, 140, 139, 137, 135, 132, 130, 125, 120, 119, 115, 114, 113, 111, 108, 105, 97, 94, 90, 89, 88, 86, 85, 83, 81, 80, 78, 77, 74, 73, 72, 70, 69, 68, 67, 63, 62, 58, 57, 56, 52, 51, 50, 48, 46, 44, 41, 38, 35, 33, 31, 29, 28, 26, 24, 21, 20, 19, 17, 16, 13, 12, 10, 7, 5, 1, 0, 200, 198, 195, 192, 190, 185, 182, 178, 176, 174, 170, 165, 163, 156, 154, 151, 148, 143, 141, 138, 136, 134, 131, 129, 124, 118, 112, 110, 107, 104, 96, 93, 87, 84, 82, 79, 76, 71, 66, 61, 55, 49, 47, 45, 43, 40, 37, 34, 32, 30, 27, 25, 23, 18, 15, 11, 9, 6, 4, 201, 189, 184, 181, 173, 169, 147, 133, 128, 123, 117, 109, 106, 103, 95, 92, 75, 65, 60, 54, 42, 39, 36, 22, 14, 8, 3, 202, 172, 168, 146, 127, 122, 116, 102, 91, 64, 59, 53, 2, 203, 126, 121, 101, 204, 100, 205, 99, 206, 98, 207, 208, 209, 210, 211, 212, 213, 214, 215, 216, 217, 218, 219, 220, 221, 222, 223.

* * * * *